United States Patent [19]
Komino

[11] Patent Number: 5,660,740
[45] Date of Patent: Aug. 26, 1997

[54] TREATMENT APPARATUS CONTROL METHOD

[75] Inventor: Mitsuaki Komino, Tokyo, Japan

[73] Assignee: Tokyo Electron Limited, Japan

[21] Appl. No.: 589,041

[22] Filed: Jan. 19, 1996

Related U.S. Application Data

[62] Division of Ser. No. 269,480, Jul. 1, 1994, Pat. No. 5,584,971.

[30] Foreign Application Priority Data

| Jul. 2, 1993 | [JP] | Japan | 5-190768 |
| Jul. 2, 1993 | [JP] | Japan | 5-190769 |
| Jul. 2, 1993 | [JP] | Japan | 5-190770 |
| Jul. 2, 1993 | [JP] | Japan | 5-190858 |
| Jul. 30, 1993 | [JP] | Japan | 5-208374 |

[51] Int. Cl.$^6$ .................. C23C 14/34; C23C 16/00; H01L 21/306
[52] U.S. Cl. .................. 216/67; 156/345; 427/8; 204/192.1; 204/298.07; 204/298.09; 204/298.15; 204/298.31; 204/298.33; 118/723 E; 118/724; 118/728; 438/715
[58] Field of Search .................. 204/192.1, 192.13, 204/192.33, 298.07, 298.09, 298.15, 298.03, 298.31, 298.32, 298.33, 298.34; 118/723 R, 723 MA, 723 MR, 723 ME, 723 MW, 723 E, 723 ER, 724, 725, 728, 663, 712; 156/345, 626.1, 643.1, 646.1; 216/59, 58, 67; 427/8

[56] References Cited

U.S. PATENT DOCUMENTS

| 4,911,812 | 3/1990 | Kudo et al. | 204/298.31 |
| 4,956,043 | 9/1990 | Kanemoto et al. | 204/298.31 |
| 5,078,851 | 1/1992 | Nishihata et al. | 204/298.31 |
| 5,147,497 | 9/1992 | Nozawa et al. | 156/345 |
| 5,252,134 | 10/1993 | Stauffer | 118/726 |
| 5,290,381 | 3/1994 | Nozawa et al. | 204/298.32 |

*Primary Examiner*—R. Bruce Breneman
*Assistant Examiner*—Rodney G. McDonald
*Attorney, Agent, or Firm*—Graham & James LLP

[57] ABSTRACT

This invention provides a method of controlling a treatment apparatus including a treatment chamber adjustable to a desired reduced-pressure atmosphere, a mounting table arranged in the treatment chamber to mount an object to be treated, a cooling medium container provided in the mounting table, and a cooling medium supply system for supplying a cooling medium to the cooling medium container and discharging the cooling medium from the cooling medium container. The method includes the steps of treating the object to be treated while decreasing the temperature of the object to be treated by cooling the mounting table by using heat transfer from the cooling medium supplied to the cooling medium container by the cooling medium supply system, and heating the vicinity of a very small gap which traps moisture in a member constituting the treatment apparatus, when the internal temperature of the treatment apparatus is to be raised.

12 Claims, 14 Drawing Sheets

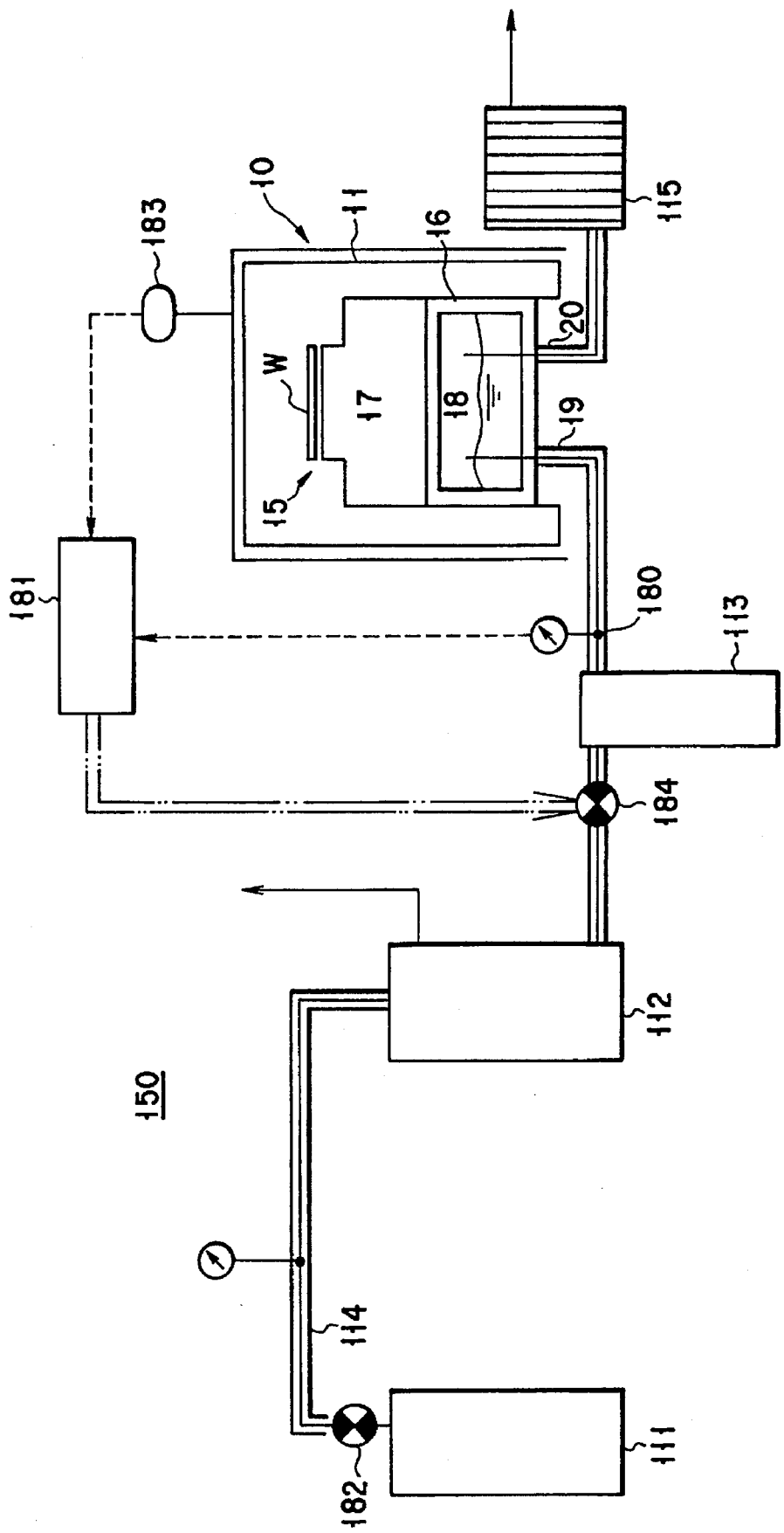
F I G. 5

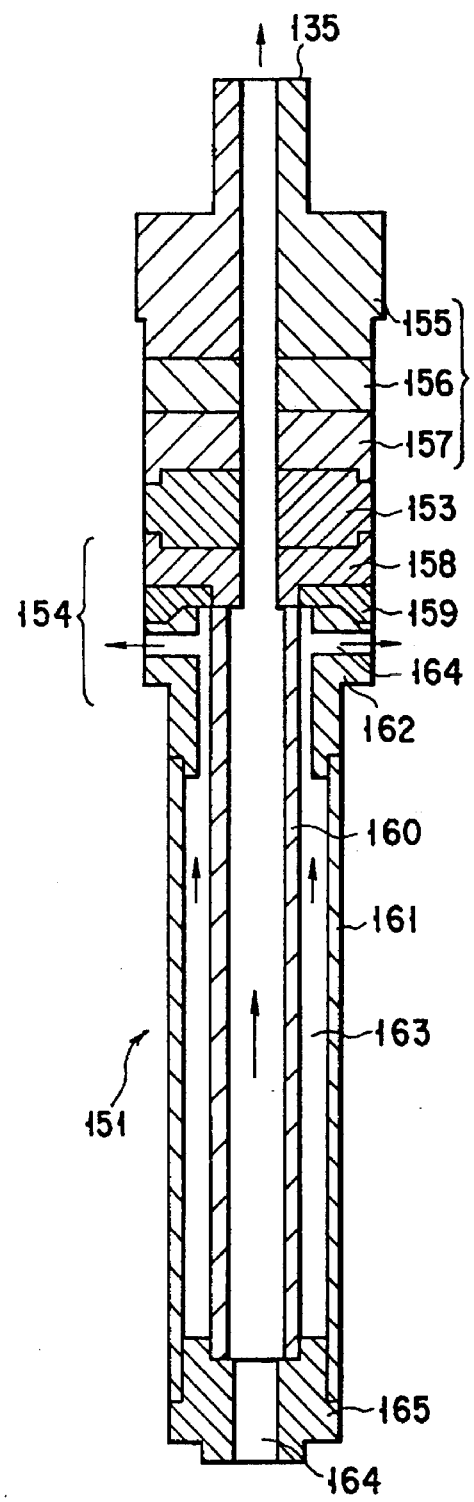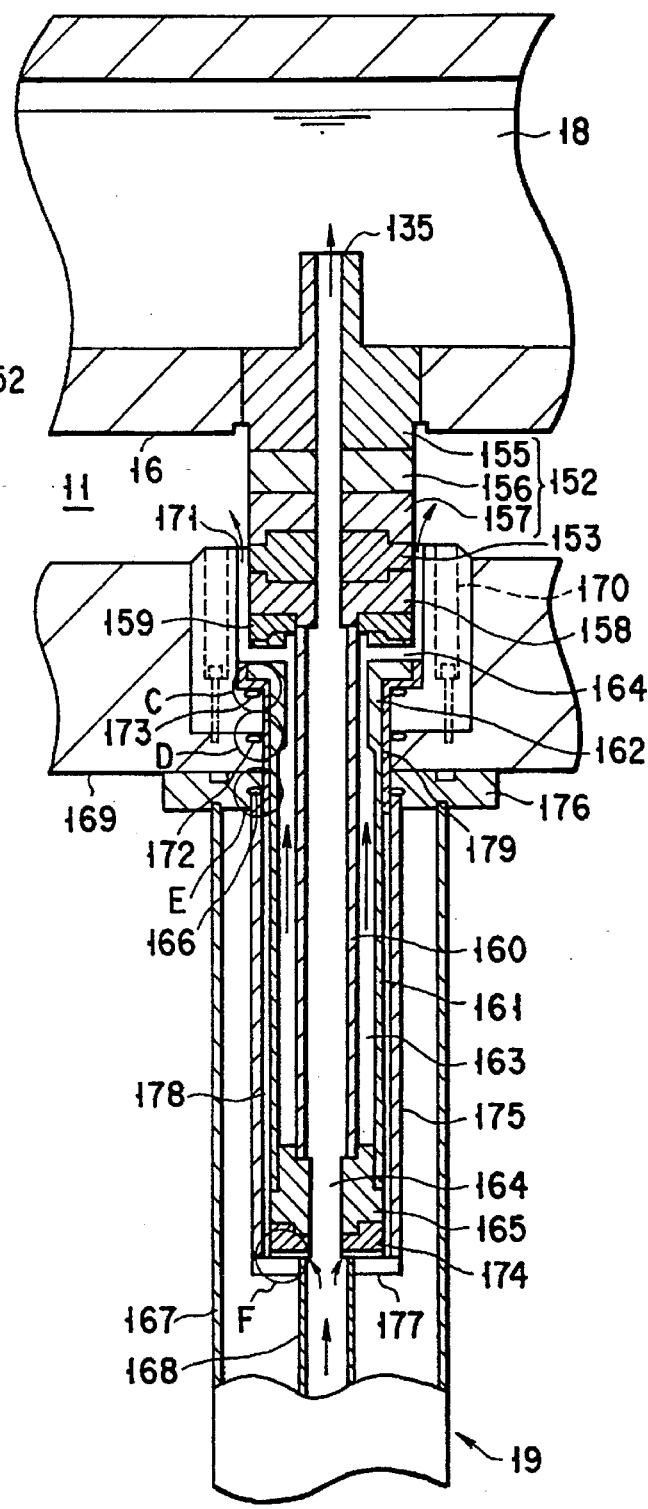
F I G. 6   F I G. 7

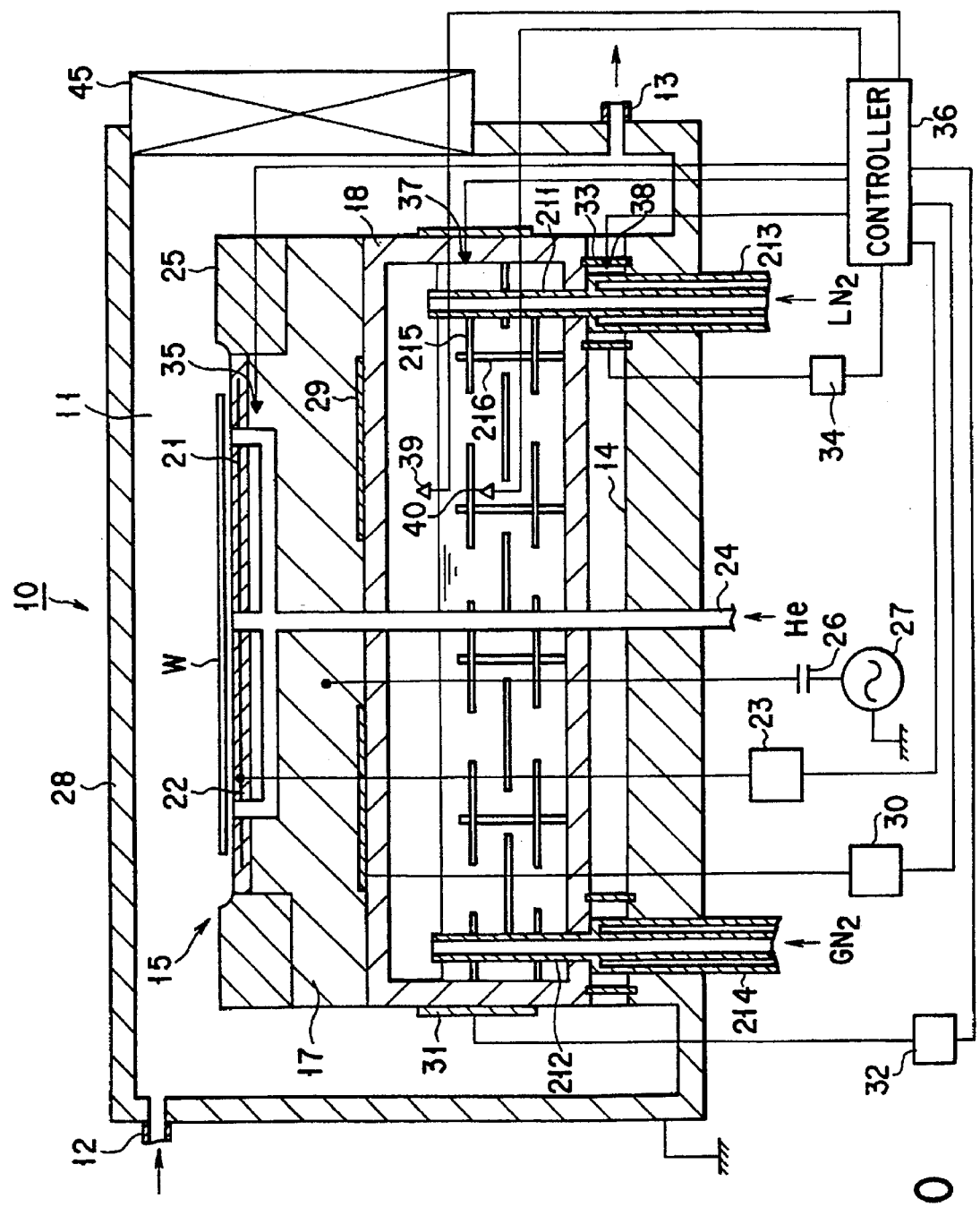
F I G. 10

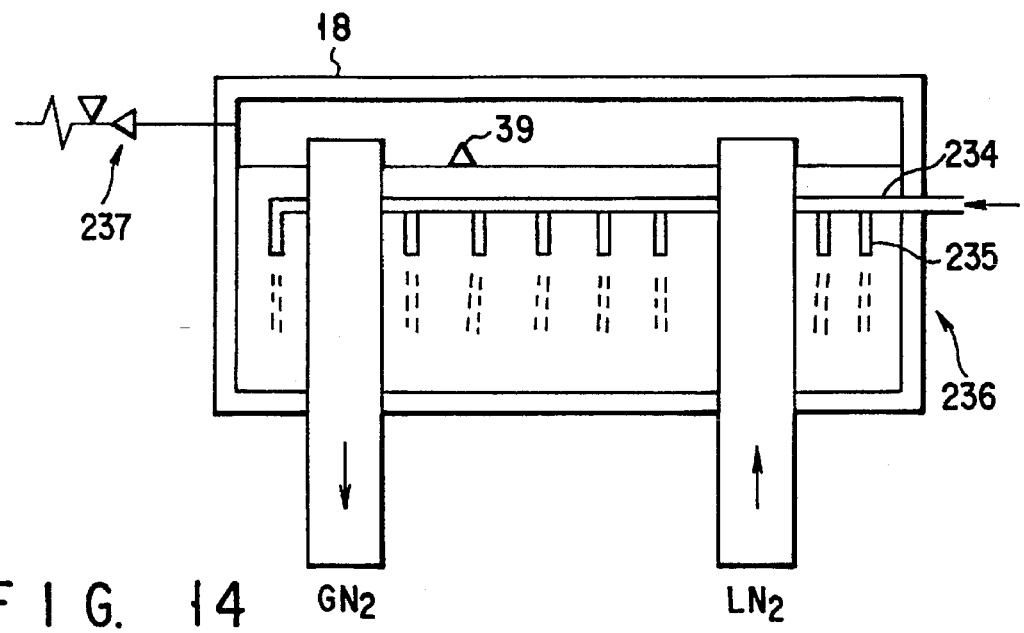
F I G. 14
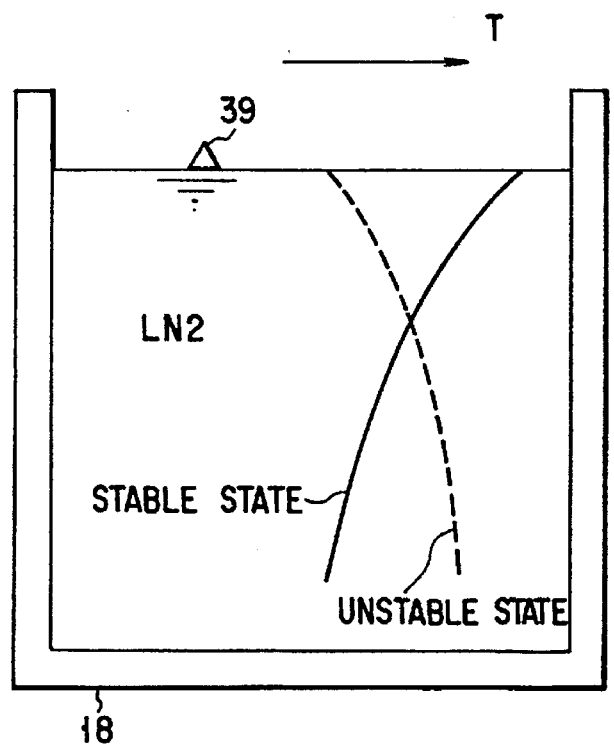
F I G. 15

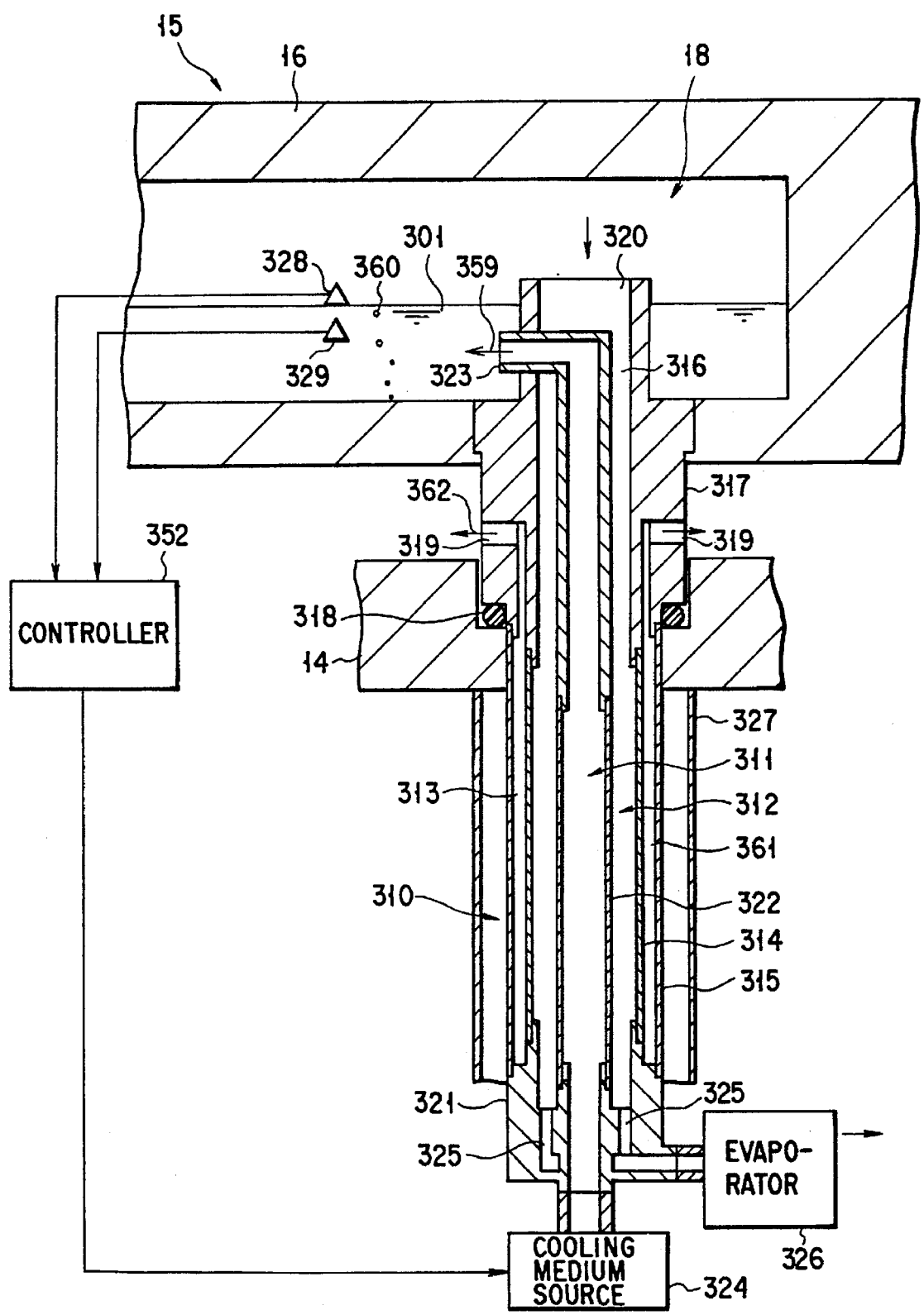
F I G. 16

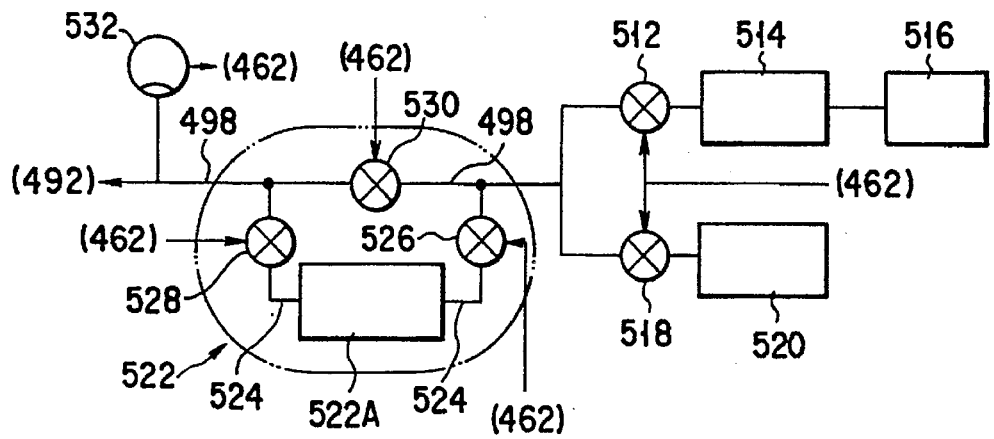
F I G. 19
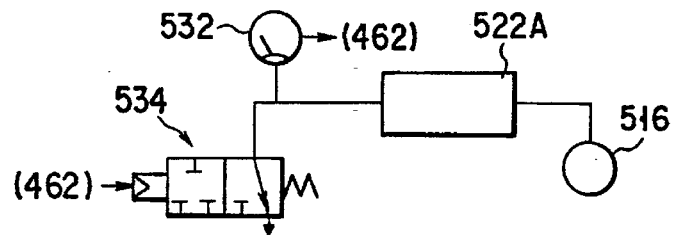
F I G. 20
F I G. 21
F I G. 22

TREATMENT APPARATUS CONTROL METHOD

This is a division of application Ser. No. 08/269,480, filed on Jul. 1, 1994 now U.S. Pat. No. 5,584,971.

BACKGROUND OF THE INVENTION

1. Field of the Invention

The present invention relates to a method of controlling a treatment apparatus and, more particularly, to a method of controlling a treatment apparatus for treating an object to be treated in a low-temperature atmosphere.

2. Description of the Related Art

In a technique, such as a dry etching technique, in which a plasma is generated by using a reactive gas and an object to be treated is treated with this plasma, the object to be treated, such as a semiconductor wafer, is etched while it is cooled in a low-temperature atmosphere, in order to perform etching in a direction perpendicular to the surface of the object to be treated and obtain a high selectivity. In this case, a low-temperature treatment technique using a cooling mechanism is employed. In this mechanism, a cooling medium container is formed in a mounting table for mounting an object to be treated, and a cooling medium is externally supplied to the cooling medium container to cool the object to be treated by the resultant heat transfer, thereby decreasing the temperature of the reaction surface of the object.

In a treatment apparatus for performing the low-temperature treatment as mentioned above, individual members are constituted not by a single material, such as aluminum, but by several different types of materials in accordance with the performance required for each member, e.g., electrical insulating properties, heat insulating properties, strength, and low-temperature resistance. Additionally, depending on the type of a treatment apparatus, different materials must be airtightly joined so that neither a gas nor a liquid leaks. In this case, several different joining techniques are selectively used in accordance with the types of materials to be joined. For example, a friction welding method is used in airtightly joining an aluminum member to a stainless steel member, an electron beam welding method is used in airtightly joining a stainless steel member to a Kovar member, and a vacuum brazing method is used in airtightly joining a ceramic member to a Kovar member.

None of the above joining techniques, however, is perfect. Therefore, if even a slight gap is present in a connected portion between members constituting a treatment apparatus, moisture in the treatment apparatus enters through this gap by, e.g., a capillary phenomenon. Since the treatment apparatus is exposed to a severe atmosphere, such as an ultra-low-temperature atmosphere, during a treatment, the moisture entering the gap in the joint portion freezes during the treatment. The treatment apparatus, on the other hand, is heated up to room temperature after the treatment, so the ice defrosts into water again. If the moisture repeatedly freezes and defrosts in the gap, the gap is widened by volume expansion during the freezing. Consequently, the gap may produce cracks in the connected portion or in the constituting members, even if the gap is initially very narrow. If cracks are formed in the connected portion or in the constituting members, a cooling medium, such as liquid nitrogen, leaks out from that portion (a cold-leak phenomenon) to vary the internal pressure of the treatment apparatus. This degrades not only the cooling function but also the function of the overall treatment apparatus. In extreme cases, the treatment apparatus fails or is broken.

Furthermore, many portions of the cooling mechanism provided in the treatment apparatus are exposed to the outer atmosphere, so it is impossible to avoid an intake of external heat, i.e., a temperature rise caused by circulation of a cooling medium. This consequently degrades the cooling function to make a stable low-temperature treatment impossible. For this reason, it is necessary to minimize the intake of external heat in the cooling mechanism.

SUMMARY OF THE INVENTION

The present invention has been made in consideration of the above situations and has its object to provide a method of controlling a treatment apparatus, which can stably perform an operation without a failure by minimizing the intake of external heat in a cooling mechanism and preventing occurrence of a cold leak in individual constituting members of the treatment apparatus and in joint portions between these members.

The above object of the present invention is achieved by a method of controlling a treatment apparatus including a treatment chamber adjustable to a desired reduced-pressure atmosphere, a mounting table arranged in the treatment chamber to mount an object to be treated, a cooling medium container provided in the mounting table, and a cooling medium supply system for supplying a cooling medium to the cooling medium container and discharging the cooling medium from the cooling medium container, comprising the steps of treating the object to be treated while decreasing a temperature of the object to be treated by cooling the mounting table by using heat transfer from the cooling medium supplied to the cooling medium container by the cooling medium supply system, and heating the vicinity of a very small gap which traps moisture in a member constituting the treatment apparatus, when an internal temperature of the treatment apparatus is to be raised.

In the treatment apparatus control method of the present invention, when the internal temperature of the treatment apparatus after the treatment is to be returned from a low temperature to room temperature, portions of members constituting the treatment apparatus where a cold leak may occur, i.e., portions from which a cooling medium leaks out, e.g., portions where members consisting of different materials are joined or portions where moisture is trapped, such as very small gaps or capillaries, are heated to sufficiently remove moisture adhered to these portions. Therefore, freezing of moisture does not take place even when the low-temperature treatment is again performed in the treatment apparatus, so formation of cracks in these portions can be prevented. This makes a stable low-temperature treatment possible.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part 0f the specification, illustrate presently preferred embodiments of the invention and, together with the general description given above and the detailed description of the preferred embodiments given below, serve to explain the principles of the invention.

FIGS. 1, 4, 10, 16, and 19 are schematic views showing plasma etching apparatuses for use in the method of the present invention;

FIG. 5 is a schematic view showing a cooling medium supply system in FIG. 4;

FIG. 6 is a sectional view showing an example of a joint device applicable to the plasma etching apparatus in FIG. 4;

FIG. 7 is an enlarged sectional view showing a state in which the joint device in FIG. 6 is attached to the plasma etching apparatus in FIG. 4;

FIGS. 11 to 14 are schematic views each showing a cooling jacket of the plasma etching apparatus in FIG. 10;

FIG. 15 is a view for explaining the temperature distribution of liquid nitrogen in the cooling jacket;

FIG. 20 is a schematic view showing the system configuration of the plasma etching apparatus in FIG. 19;

FIG. 21 is a schematic view showing a main part of another example of the system configuration of the plasma etching apparatus in FIG. 19; and FIG. 22 is a schematic view showing a main part of a cooling jacket of the plasma etching apparatus in FIG. 19.

DETAILED DESCRIPTION OF THE PREFERRED EMBODIMENTS

The embodiments in which a method of controlling a treatment apparatus according to the present invention is applied to a plasma etching apparatus will be described below with reference to the accompanying drawings.

First Embodiment

Figure 1:
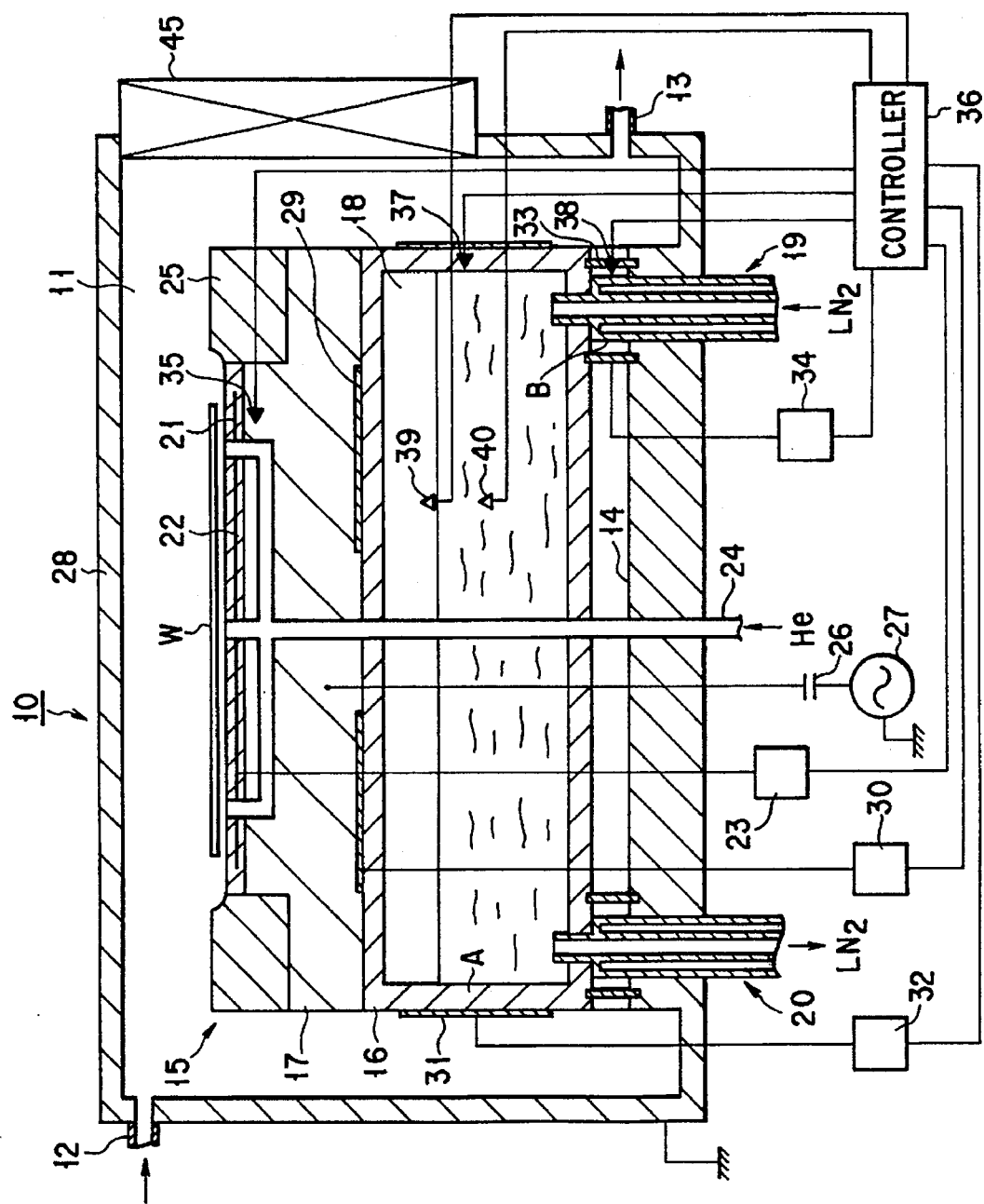

FIG. 1 is a schematic view showing a plasma etching apparatus (to be referred to as an etching apparatus hereinafter) for use in the method of the present invention. In FIG. 1, reference numeral 10 denotes the etching apparatus. The etching apparatus 10 has a substantially cylindrical treatment chamber 11 consisting of a conductive material, e.g., aluminum, and having airtightness (against liquids and gases). A treatment gas inlet port 12 is formed near the top of the treatment chamber 11, so that a predetermined treatment gas, such as HF, can be introduced into the treatment chamber 11 from a gas source via a mass flow controller (neither is shown). In addition, an exhaust port 13 is formed near the bottom of the treatment chamber 11, so that the treatment chamber 11 can be evacuated to a desired reduced-pressure atmosphere via an exhausting means, e.g., a vacuum pump (not shown).

In an almost middle of the treatment chamber 11, a substantially columnar mounting table 15 is so housed as to be kept electrically insulated from a bottom 14 of the treatment chamber 11. An object to be treated, such as a semiconductor wafer W, can be mounted on the upper surface of this mounting table 15. The mounting table 15 is constituted by a substantially columnar susceptor support table 16 consisting of, e.g., aluminum, and a susceptor 17 detachably mounted on the susceptor support table 16 by using, e.g., bolts and consisting of, e.g., aluminum.

In the susceptor support table 16, a cooling medium container, e.g., a cooling jacket 18 for flowing and circulating a cooling medium, such as liquid nitrogen, is formed. This cooling jacket 18 has a cooling medium supply pipe line 19 and a cooling medium discharge pipe line 20. Therefore, a cooling medium supplied from a cooling medium source (not shown) can be introduced into the cooling jacket 18 from the cooling medium supply pipe line 19 through an appropriate piping means, e.g., vacuum double-insulated piping, circulated as a coldness source in the cooling jacket 18, and discharged outside the etching apparatus 10 through the cooling medium discharge pipe line 20.

The susceptor 17 is a disk-like member having a projecting portion at its center, and a fixing means, such as an electrostatic chuck 21, for mounting and fixing the semiconductor wafer W (to be referred to as a wafer hereinafter) is provided on the mounting surface of the projecting portion. This electrostatic chuck 21 is formed by, e.g., sandwiching a conductive film 22, such as a copper foil or a silver foil, between two polyimide films. A Coulomb's force is generated between the electrostatic chuck 21 and the wafer W by applying a high voltage to the conductive film 22 from a DC high-voltage source 23. This makes it possible to chuck and hold the wafer W to the surface of the electrostatic chuck 21. On the mounting surface of the susceptor 17, a heat transfer gas supply means 24 is arranged to supply a heat transfer medium, such as helium gas, from a gas source (not shown) to the lower surface of the wafer W mounted on the mounting surface.

Also, an annular focus ring 25 is arranged on the upper peripheral portion of the susceptor 17 so as to surround the wafer W. This focus ring 25 consists of an insulating material which does not attract reactive ions. Therefore, the focus ring 25 causes reactive ions, generated in the treatment chamber 11, to be incident on only the wafer W placed inside the chamber, thereby improving the etching efficiency.

An RF power supply 27 is connected to the susceptor 17 via a matching capacitor 26. This RF power supply 27 applies RF power of, e.g., 380 kHz to the susceptor 17 which constitutes the lower electrode. Consequently, a reactive plasma is generated between the susceptor 17 and a top wall 28 of the treatment chamber 11, which constitutes the upper electrode, and this makes it possible to etch the surface to be treated of the wafer W.

A heater 29 for temperature adjustment is provided between the susceptor 17 and the susceptor support table 16. By applying electric power from a power supply 30 to this heater 29 to allow the heater 29 to function as a heat source, it is possible to optimally adjust the quantity of coldness that is transferred to the wafer W from the cooling jacket 18 provided in the susceptor support table 16. Similarly, a first heating means 31 consisting of a ceramic heater, a silicon heater, and the like is provided around the cooling jacket 18. By applying electric power from a power supply 32 to this first heating means 31, it is possible to raise the temperature of a predetermined portion A of the cooling jacket 18 to a predetermined temperature. This portion A is a portion (to be referred to as a moisture trap portion hereinafter) where members consisting of different materials are joined, a very small gap or capillary is present, and a cold leak can take place when moisture is trapped in the gap or capillary. Also, a second heating means 33 consisting of a ceramic heater, a silicon heater, and the like is provided at a predetermined position around the cooling medium supply pipe line 19 and the cooling medium discharge pipe line 20. By applying electric power from a power supply 34 to this second heating means 33, it is possible to heat a predetermined portion B, i.e., a moisture trap portion of each of the pipe lines 19 and 20 up to a predetermined temperature.

Furthermore, a first temperature detecting means 35, such as a fluoroptic temperature probe or a thermocouple, for detecting the temperature of the wafer W is provided near the electrostatic chuck 21. Information of the temperature detected by this first temperature detecting means 35 is transmitted to a controller 36, and the controller 36 controls, e.g., the output from the heater 29 on the basis of this information. Likewise, a second temperature detecting means 37 for detecting the temperature of the predetermined portion A of the cooling jacket 18 is provided near the first cooling means 31. Information of the temperature detected by the second temperature detecting means 37 is also transmitted to the controller 36. A third temperature detecting means 38 for detecting the temperature of the predetermined portion B of each of the pipe lines 19 and 20 is provided near the second heating means 33. Information of the temperature detected by this third temperature detecting means 38 is also transmitted to the controller 36.

In the cooling jacket 18, an upper liquid level detector 39 and a lower liquid level detector 40 for measuring the liquid level of the cooling medium in the cooling jacket 18 are arranged. The upper and lower liquid level detectors 39 and 40 transmit information of the liquid level of the cooling medium to the controller 36, and the controller 36 adjusts the supply quantity of the cooling medium to be introduced from the cooling medium supply pipe line 19 into the cooling jacket 18. The plasma etching apparatus 10 for use in the treatment apparatus control method according to the present invention is arranged as described above.

In performing a low-temperature treatment by using the etching apparatus with the above arrangement, a so-called cold leak may occur in a portion where members consisting of different materials are joined, e.g., in a portion (A in FIG. 1) of the wall of the cooling jacket 18 or in a portion (B in FIG. 1) of the cooling medium supply pipe line 19 or the cooling medium discharge pipe line 20, i.e., in a so-called moisture trap portion. The present invention aims at preventing the occurrence of this cold leak in the moisture trap portion and thereby ensure a failure-free operation of the treatment apparatus. To assure a better understanding of the present invention, the mechanism of occurrence of the cold leak in the moisture trap portion will be briefly described below with reference to FIGS. 2A to 2E.

Figure 2A:
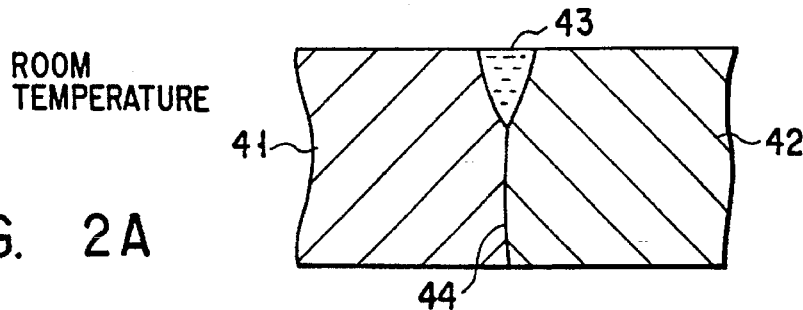
FIGS. 2A to 2E are views for explaining a cold leak.

As shown in FIG. 2A, even if members consisting of the same material, e.g., a member 41 consisting of stainless steel and stainless steel 42 are joined airtightly (against a gas and a liquid) in a joint portion 43, a very small gap or capillary 44 is formed in the joint area.

Figure 2B:
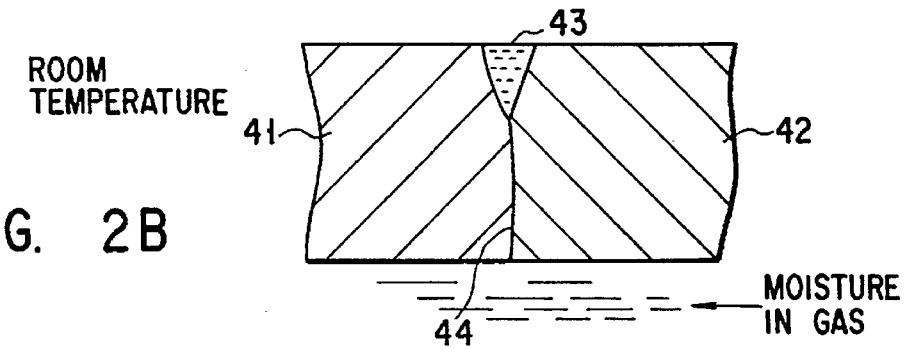
Figure 2C:
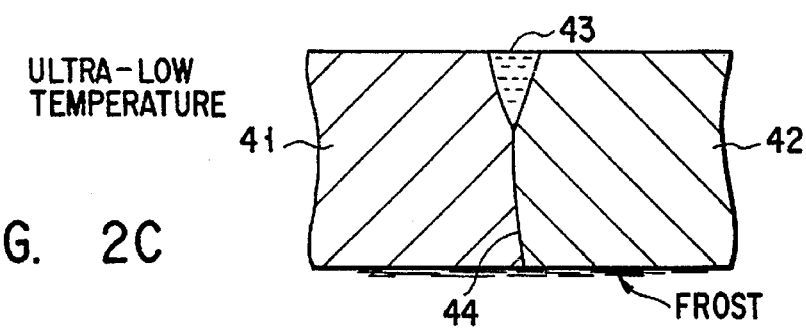
Figure 2D:
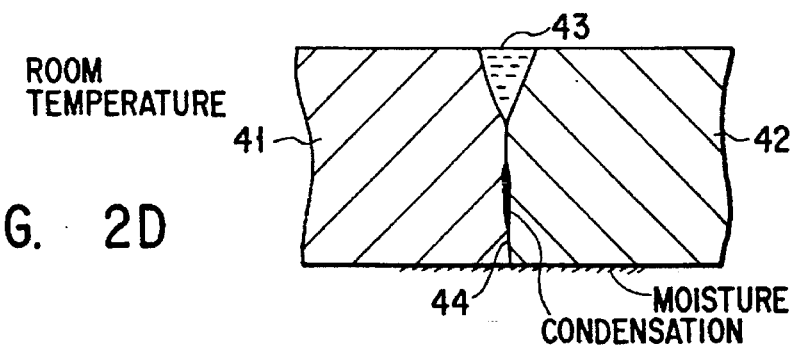
Figure 2E:
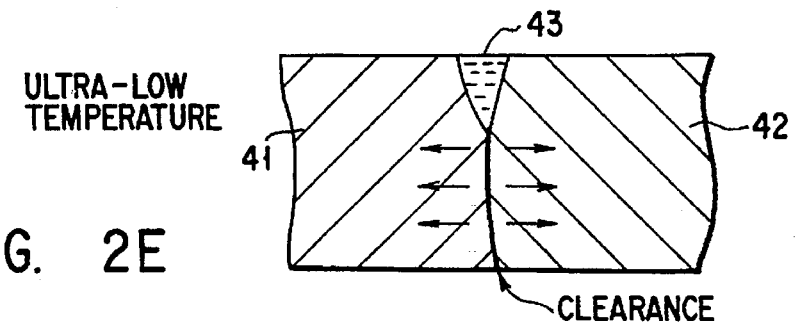

If the joint portion having this capillary 44 is exposed to a gas containing moisture at room temperature, as shown in FIG. 2B, and placed in an atmosphere at an ultra-low temperature, as shown in FIG. 2C, the moisture contained in the gas freezes and adheres, as frost, to the outer surface of that portion. Thereafter, when the joint portion is again returned to room temperature, as shown in FIG. 2D, the frost adhered on the outer surface melts and forms waterdrops on the surface. These waterdrops are sucked into the capillary of the joint portion by a so-called capillary phenomenon and left behind in the capillary. If the joint portion is cooled to an ultra-low temperature again with the moisture contained in the capillary, the moisture freezes and expands to produce a stress in a direction in which the joint portion is separated, as shown in FIG. 2E. If this operation is repeated, cracks are formed in the joint portion and a cooling medium sealed in that portion leaks in some cases. This phenomenon is generally called a cold leak.

Figure 3:
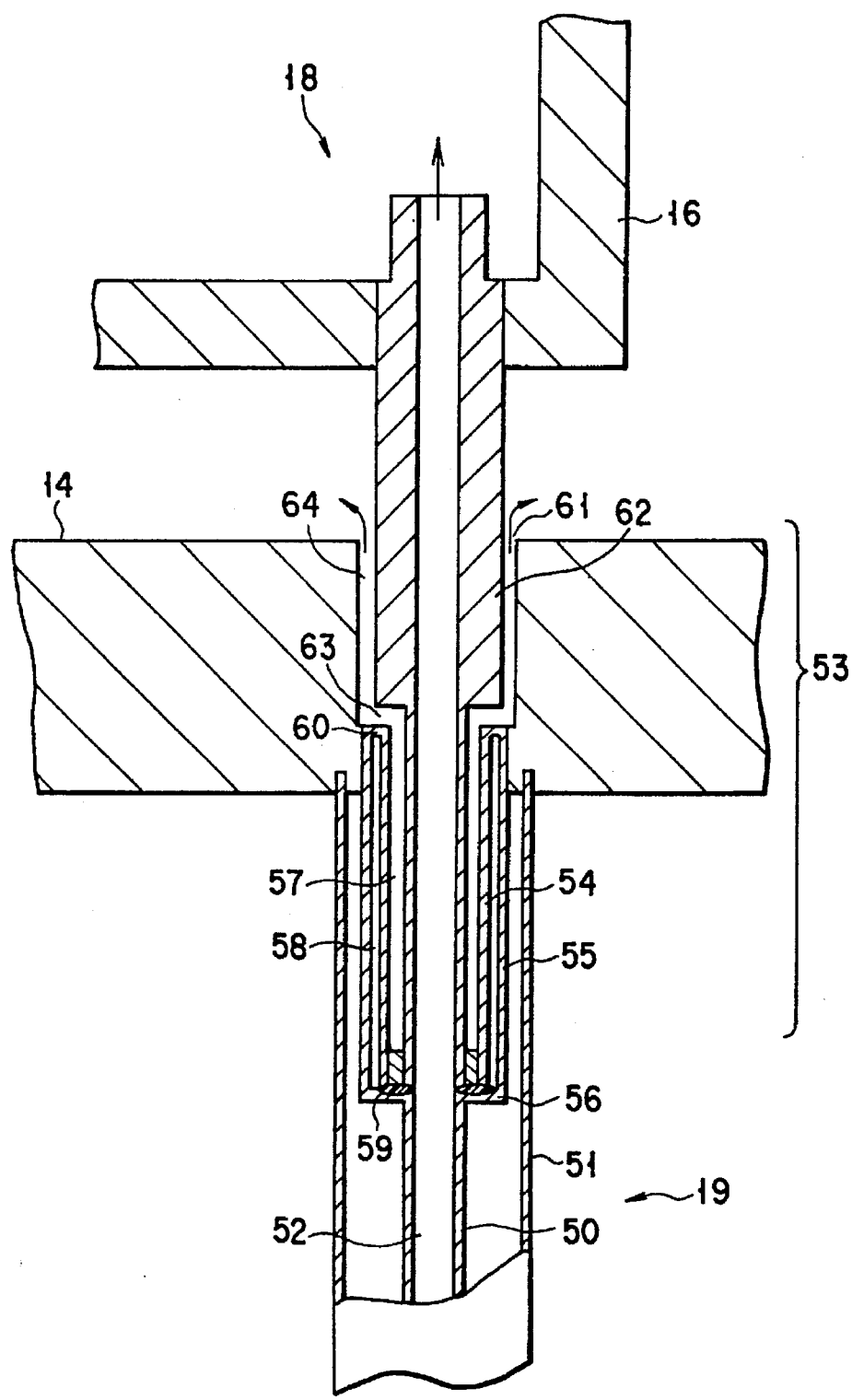
FIG. 3 is a schematic view showing a cooling medium supply pipe line in which occurrence of a cold leak is expected.

The influence that this cold leak has on the etching apparatus if the cold leak takes place in the cooling medium supply pipe line 19 will be described in detail below with reference to FIG. 3. As shown in FIG. 3, the cooling medium supply pipe line 19 has a double-insulated piping structure consisting of, e.g., stainless steel. This double-insulated piping structure is constituted by an inner pipe 50 and an outer pipe 51 which is concentrically arranged outside the inner pipe 50. A cooling medium supplied from a cooling medium source (not shown) can be introduced into the cooling jacket 18 from a supply port through a passage 52 inside the inner pipe 50. The thickness of the inner pipe 50 is increased toward the outer circumference in a portion 62 inside the bottom 14 of the treatment chamber.

As a joint portion 53 for connecting the cooling medium supply pipe line 19 to the bottom 14 of the etching apparatus 10, first and second auxiliary pipes 54 and 55 are formed between the inner and outer pipes 50 and 51 so as to be coaxially fixed to a flange 56 formed at a predetermined portion of the inner pipe 50. The first and second auxiliary pipes 54 and 55 effectively prevent leakage of the cooling medium and escape of heat. With this arrangement, a first annular space 57 is formed between the inner pipe 50 and the first auxiliary pipe 54, and a second annular space 58 is formed between the first and second auxiliary pipes 54 and 55. The first space 57 develops toward the circumference along the outline of the thick-wall portion of the inner pipe 50 in a portion 63 inside the bottom 14 of the treatment chamber, and extends vertically in a portion 64 along the outer circumference of the inner pipe 50.

Spacings between the cooling medium flow path 52 and the first space 57 and between the flow path 52 and the second space 58 are airtightly sealed by an appropriate sealing member 59 made of, e.g., polytetrafluoroethylene (Teflon), polychlorotrifluoroethylene (PCTFE), pulverized fuel ash (PFA), or fluoroelastomer ($^R$Kel-f). In addition, the upper end of the second space 58 opens at the portion 63 of the first space 57 which develops toward the outer circumference, and this opening is airtightly sealed by a sealing member 60. Furthermore, the upper end of the first space 57 communicates with the treatment chamber 11 at an opening 61. Therefore, when the treatment chamber 11 is evacuated, the first space 57 is also evacuated. This makes it possible to increase the insulation efficiency for the cooling medium flowing through the cooling medium flow path 52.

When an operation of setting the etching apparatus at an ultra-low temperature by introducing a cooling medium, e.g., liquid nitrogen at $-196°$ C. to the cooling medium flow path 52 and returning the apparatus to room temperature is repeatedly executed in the above arrangement, cracks are sometimes formed to cause a cold leak in, e.g., the sealed portions 59 and 60, as explained above with reference to FIGS. 2A to 2E. If the cooling medium is introduced to the flow path 52 with the cracks formed, the cooling medium leaks into the second space 58 through the sealed portion 59, into the first space 57 through the sealed portion 60, and into the treatment chamber 11 from the opening 61. Consequently, the gasified liquid nitrogen varies the treatment pressure in the treatment chamber to degrade the function of the etching apparatus, leading to a reduction in the yield and the throughput of products.

The present invention aims at preventing occurrence of the cold leak as mentioned above. For this purpose, the first and second heating means 31 and 33 are provided to heat portions where the cold leak is expected to take place, i.e., portions (moisture trap portions) illustrated by the portions A and B in FIG. 1, e.g., portions where members consisting of different materials are joined. When the etching apparatus is returned from an ultra-low temperature to room temperature, the first and second heating means 31 and 33 heat these moisture trap portions to evaporate moisture present in these portions, thereby removing the moisture. Consequently, the moisture is perfectly removed from the moisture trap portions. Therefore, even if the apparatus is again cooled to an ultra-low temperature, no cracks are formed in these moisture trap portions by freezing and expansion of moisture because there is no residual moisture in these portions. This makes it possible to effectively prevent occurrence of the cold leak resulting from cracks.

In heating the moisture trap portions, the second and third temperature detecting means 37 and 38 arranged near the moisture trap portions to measure the temperatures of these portions are used to measure the temperatures of the moisture trap portions, and information of the measured values is transmitted to the controller 36. The heating is performed until the measured values reach a preset value, e.g., 120° C. In this case, it is preferable that the heating be continued for a certain period of time, e.g., 15 minutes in order to completely remove moisture from the moisture trap portions.

It is also possible to heat the moisture trap portions by experimentally determining the output of the heating means and/or the heating time required to remove moisture from these moisture trap portions and operating the heating means at a predetermined output for a predetermined time on the basis of the experimentally determined values. When this arrangement is employed, the second and third temperature detecting means 37 and 38 can be omitted. Consequently, the structure of the etching apparatus 10 can be simplified.

In this manner, it is possible to prevent occurrence of the cold leak in the moisture trap portions by effectively evaporating moisture from these moisture trap portions.

An operation of the plasma etching apparatus to which the treatment apparatus control method according to the present invention is applied will be briefly described below.

First, the wafer W stored in a cassette chamber (not shown) is transferred to a load lock chamber (not shown) by a predetermined transfer arm. The wafer W is then transferred from the load lock chamber to the treatment chamber 11, in which the pressure is reduced to a predetermined pressure, e.g., about $1 \times 10^{-4}$ to several tens Torr, through a gate valve 45, and is mounted on the mounting surface of the susceptor 17 of the mounting table 15 in the treatment chamber 11. Thereafter, the wafer W is chucked and held by the electrostatic chuck 21.

Subsequently, a cooling medium, e.g., liquid nitrogen is supplied from a cooling medium supply source (not shown) into the cooling jacket 18 through the cooling medium supply pipe line 19, and the surface to be treated of the wafer W is cooled to a desired temperature by the transfer of coldness from the cooling medium. This temperature is detected by the first temperature detecting means 35 at any instant, and the controller 36 operates the heater 29 or the like on the basis of the detection signal. Consequently, the wafer W is held at the predetermined temperature. In returning the etching apparatus, in which the low-temperature treatment is performed, to room temperature, the first and second heating means 31 and 33 heat portions where occurrence of a cold leak is expected, i.e., moisture trap portions, thereby removing moisture from these portions. Therefore, even when a treatment is performed at an ultra-low temperature, no cold leak takes place due to freezing and expansion of moisture because there is no residual moisture. This makes it possible to effectively avoid formation of cracks in the constituting members.

Subsequently, a treatment gas, e.g., HF is supplied from the treatment gas inlet port 12 into the treatment chamber 11 held in this optimum treatment environment, and RF power is applied from the RP power supply 27 to the susceptor 17 as the lower electrode. Consequently, a plasma of the treatment gas is generated in the treatment chamber 11, and the surface to be treated of the wafer W is etched by this plasma.

After the etching, the residual treatment gas and the reaction products are well exhausted from the treatment chamber 11. Thereafter, the wafer W is transferred to the load lock chamber through the gate valve 45 and to the cassette chamber by the transfer arm. In this fashion, a series of treatment processes are completed.

Second Embodiment

This embodiment provides a method of controlling a treatment apparatus, which can stably supply a cooling medium to a mounting table, and, if the cooling medium leaks from a cooling medium supply system due to a cold leak or other cause, can sense the abnormality of the cooling medium supply system to stop the supply of the cooling medium before the cooling medium affects the function of the treatment apparatus or makes the apparatus fail.

That is, this embodiment provides a method of controlling a treatment apparatus including a pressure stabilizing means provided in a cooling medium supply system to maintain the supply pressure of a cooling medium to be supplied to a cooling medium container constant, a pressure detecting means provided downstream of the pressure stabilizing means to detect the supply pressure of the supplied cooling medium, and an arithmetic means for calculating the change rate of the supply pressure of the cooling medium detected by the pressure detecting means, wherein if the pressure value detected by the pressure detecting means exceeds a predetermined value and the change rate of the pressure value calculated by the arithmetic means also exceeds a predetermined value, the cooling medium supply system is shut off to stop the supply of the cooling medium to the cooling medium container.

In the treatment apparatus control method according to this embodiment, the cooling medium supply pressure maintained constant by the pressure stabilizing means is detected by the pressure detecting means, and, if both the supply pressure value of the cooling medium detected by the pressure detecting means and the change rate of the pressure value exceed their respective predetermined values, the supply of the cooling medium to the cooling medium container of a mounting table is interrupted. This makes it possible to sense and avoid an event in which a cold leak of the cooling medium produces an influence on the function of the treatment apparatus. Consequently, the cooling medium can be supplied at a stable pressure to the cooling medium container of the mounting table, so an object to be treated can be cooled accurately. It is also possible to carry out a stable low-temperature treatment since the supply of the cooling medium can be interrupted before a leakage cooling medium flows into a treatment chamber to adversely affect the treatment pressure.

Figure 4:
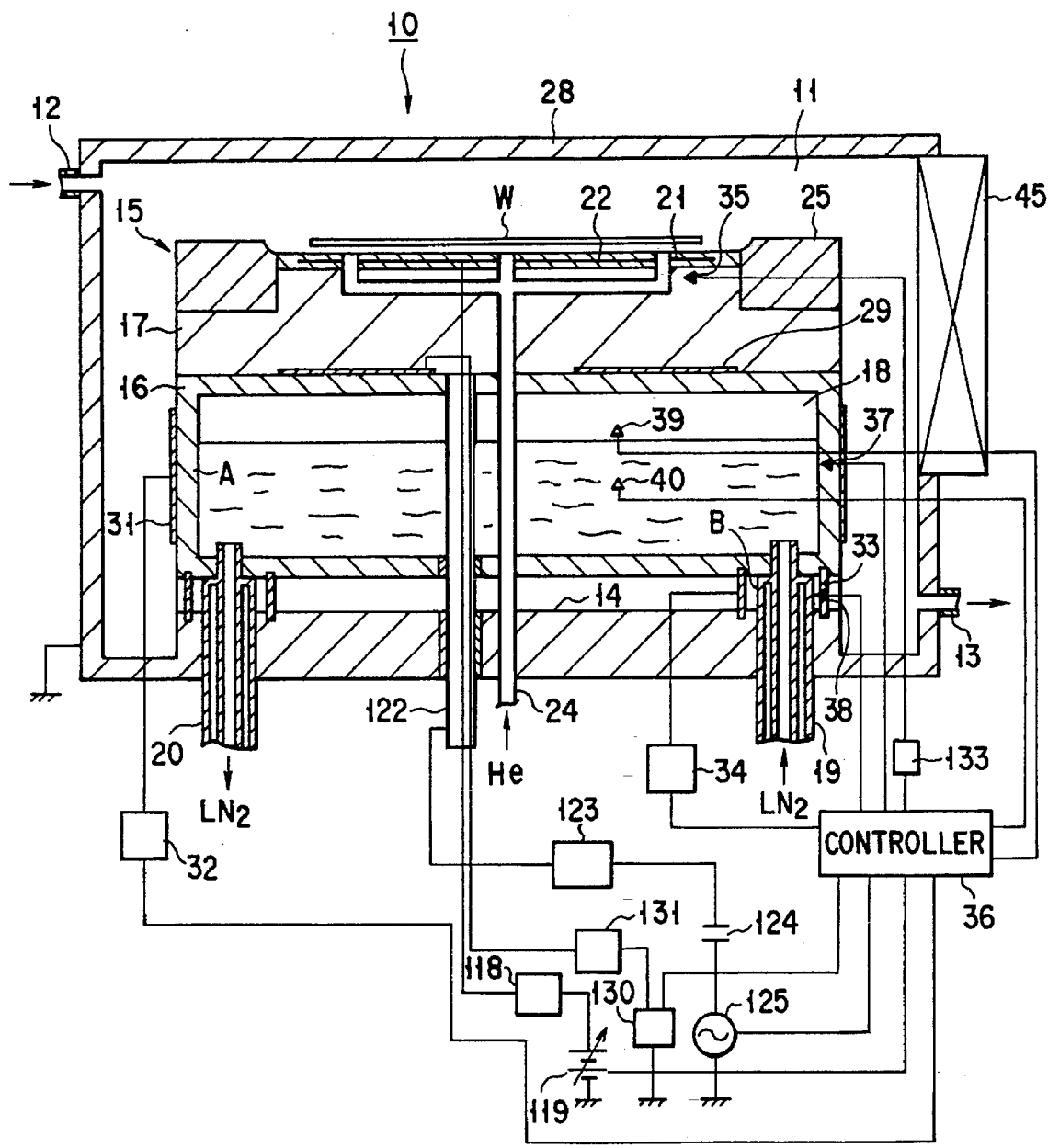

A system in which the treatment apparatus control method according to this embodiment is applied to a plasma etching apparatus will be described below with reference to the accompanying drawings. FIG. 4 is a schematic view showing the plasma etching apparatus according to this embodiment. In FIG. 4, the same reference numerals as in FIG. 1 denote the same parts, and a detailed description thereof will be omitted.

As shown in FIG. 5, a cooling medium, e.g., liquid nitrogen is supplied from a cooling medium source 111, e.g., tank to a proper piping means 114, e.g., vacuum double-insulated piping via a gas-liquid separator 112 and a sub-cooler 113, and introduced into a cooling jacket 18 formed in a susceptor support table 16 from a cooling medium supply pipe line 19. The cooling medium is then circulated in the cooling jacket 18, discharged from a cooling medium discharge pipe line 20, and exhausted outside the system via an evaporator 115.

A pipe lead 122 made of a hollow conductor is formed in a susceptor 17 through the susceptor support table 16. Through this pipe lead 122, RF power of, e.g., 380 kHz can be applied to the susceptor 17 as the lower electrode from an RF power supply 125 through a noise-cut filter 123 and a matching capacitor 124, thereby generating a plasma in a treatment chamber 11. In FIG. 4, a top wall 28 of the treatment chamber 11 which is grounded outside the apparatus serves as the upper electrode. However, it is also possible to use a hollow member having a large number of small holes formed in a surface opposing a wafer and capable of uniformly introducing, into the treatment chamber 11, a treatment gas, e.g., $CF_4$ supplied from a treatment gas source through a gas supply pipe line and a mass flow controller.

A temperature adjusting heater 29 is arranged between the susceptor 17 and the susceptor support table 16. By applying electric power to this heater 29 from a power supply 130 through a filter 131 to allow the heater 29 to function as a heat source, it is possible to optimally adjust the quantity of coldness that is transferred to a wafer W from the cooling jacket 18 provided in the susceptor support table 16. In addition, a first temperature detecting means 35, e.g., a lacustrone or a thermocouple, for detecting the temperature of the wafer W is provided near an electrostatic chuck 21. Information of the temperature detected by this first temperature detecting means 35 is transmitted to a controller 36 through a filter 133, and the controller 36 controls, e.g., the output from the heater 29 on the basis of this information.

A conductive film 22 of the electrostatic chuck 21 is electrically connected to a DC high-voltage source 119 through a filter circuit 118. By applying a high voltage from the DC high-voltage source 119, a Coulomb's force is generated between the electrostatic chuck 21 and the wafer W, and this makes it possible to attract and hold the wafer W to the surface of the electrostatic chuck 21. A plasma etching apparatus 10 for use in the treatment apparatus control method according to this embodiment is arranged as described above.

In the etching apparatus 10 with the above arrangement, in supplying a cooling medium from an external cooling medium supply system 150 into the cooling jacket 18 inside a mounting table 15, it is necessary to obtain electrical insulation between the susceptor support table 16 and the bottom wall of the treatment chamber 11 and between the cooling medium supply pipe line 19 and the cooling medium discharge pipe line 20 and to prevent leakage of coldness into the treatment chamber 11. For this purpose, joint devices 151 is disclosed in Japanese Patent Application No. 4-353046 filed by the same applicant as the applicant of this application are inserted between a cooling medium supply port 135 and the cooling medium supply pipe line 19 and between a cooling medium discharge port 136 and the cooling medium discharge pipe line 20 in the cooling jacket 18.

The structure of these joint devices 151 will be briefly described below with reference to FIGS. 6 and 7. Note that the structure of only the joint device 151 for the cooling medium supply pipe line 19 is illustrated in an enlarged scale in FIGS. 6 and 7, but the joint device for the cooling medium discharge pipe line also has an identical structure, so a detailed described thereof will be omitted.

As shown in FIG. 6, this joint device 151 consists primarily of a container-side coupling unit 152, an electrically insulating heat-insulating member 153, and a cooling medium passage-side coupling unit 154. The container-side coupling unit 152 has a flow path at its center and is so inserted as to communicate with the cooling medium container. The heat-insulating member 153 consists of a material, e.g., ceramics such as alumina, having a low thermal conductivity and high electrical insulating properties. The member 153 has a flow path at its center and is connected to the container-side coupling unit 152. The cooling medium passage-side coupling unit 154 has a flow path at its center and is connected to the heat-insulating member 153 and to the cooling medium supply pipe line 19. Note that the flow paths of these members are so designed as to communicate with each other.

The container-side coupling unit 152 has a three-layer structure constituted by an end portion 155, a ring member 156, and a buffer member 157. The end portion 155 is entirely fixed airtightly to the partition wall of the cooling jacket 18 so that the upper supply port 135 extends inside the cooling jacket 18. The end portion 155 consists of a conductive material, e.g., aluminum. The ring member 156 is connected to the end portion 155 by, e.g., a friction welding method and consists of stainless steel or the like. The buffer member 157 is connected to the ring member 156 by, e.g., an electron beam welding method and consists of Kovar or the like. The ring-like heat-insulating member 153 is connected to this buffer member 157 by, e.g., a vacuum brazing method, and realizes electrical insulation for radio frequencies and insulation of heat for liquid nitrogen.

The cooling medium passage-side coupling unit 154 connected to the heat-insulating member 153 has a vacuum double-pipe structure consisting of, e.g., stainless steel. A buffer member 158 consisting of, e.g., Kovar is connected to the upper end portion of this double-pipe structure by butt welding or the like. The buffer member 158 is connected to the heat-insulating member 153 by, e.g., the vacuum brazing method. Additionally, an auxiliary heat-insulating member 159 consisting of, e.g., Teflon is fitted on the lower peripheral portion of the buffer member 158.

The vacuum double-insulated structure of the cooling medium passage-side coupling unit 154 is constituted by an inner pipe 160 consisting of, e.g., stainless steel, and an outer pipe 161 concentrically arranged outside the inner pipe 160 with a predetermined distance between them and consisting of, e.g., stainless steel. The upper portion of the outer pipe 161 is connected to a joint member 162 made of, e.g., stainless steel. In this joint member 162, an annular space defined between the inner and outer pipes 160 and 161, i.e., a communication path 164 for allowing a vacuum chamber 163 to communicate with the treatment chamber 11 is formed. With this structure, when the treatment chamber 11 is evacuated during a treatment, the vacuum chamber 163 can be evacuated at the same time, and this prevents outward transfer of coldness. A lower joint member 165 having a flow path 164 in its central portion and consisting of a stainless steel or the like is provided at the lower ends of the inner and outer pipes 160 and 161. The lower joint member 165 connects the cooling medium supply pipe line 19 of the cooling medium supply system 150 to the joint device 151 as described below.

A state in which the cooling medium supply pipe line 19 having a vacuum double-insulated pipe structure constituted by outer and inner pipes 167 and 168 made of, e.g., stainless steel is connected to the cooling jacket 18 of the etching apparatus 10 by the joint device 151 with the above arrangement will be described below with reference to FIG. 7.

The lower portion of the joint device 151 is received in a recessed through auxiliary member 170 fixed by bolts or the like to a step-like through hole formed in a bottom 169 of the treatment chamber. Consequently, a ring-like flow path 171 which permits the treatment chamber 11 and the vacuum chamber 163 to communicate with each other is formed between the inner circumferential surface of the through auxiliary member 170 and the outer circumferential surface of the joint device. Sealing members 173 and 172 are inserted in a portion C where the bottom 169 of the treatment chamber is in contact with the joint member 162 and in a portion D where the through auxiliary member 170 is in contact with the joint member 162, respectively, in order to seal these portions from the outer atmosphere.

The upper end of the inner pipe 168 of the cooling medium supply pipe line 19 of the cooling medium supply system 150, in which the cooling medium flows, is joined to the lower end of the flow path 164 of the lower joint member 165, so that the cooling medium can be supplied into the inner pipe 160 of the joint device 151. An inner auxiliary stainless steel pipe 175 is provided at the upper end of the inner pipe 168 of the cooling medium supply system 150 so as to surround the outer pipe 161 of the joint device 151 via a flange-like auxiliary member 177. In a portion indicated by symbol E, the upper ends of the inner auxiliary stainless steel pipe 175 and the outer pipe 167 are airtightly connected by a sealing member 166 to the bottom 169 of the treatment chamber via a stainless steel flange 176. In addition, in a portion indicated by symbol F, the lower end of the inner auxiliary stainless steel pipe 175 is airtightly connected to the upper end of the inner pipe 168 of the cooling medium supply pipe line 19 by a ring-like Teflon seal 174 provided in the lower portion of the lower joint member 165.

As discussed above, the cooling medium supplied from the cooling medium supply system 150 flows from the flow path formed inside the inner pipe 168 of the cooling medium supply pipe line 19 to the flow path formed inside the inner pipe 160 of the joint device 151 without any leak. The cooling medium is then introduced into the cooling jacket 18 through the cooling medium supply port 135 and used as a coldness source for cooling the reaction surface of the wafer W, as an object to be treated, to a desired temperature. Since the portions C, D, E, and F are airtightly sealed by the sealing members 173, 172, 166, and 174, respectively, no cooling medium leaks into a space 178 defined between the outer pipe 161 of the cooling jacket 18 and the inner auxiliary stainless steel pipe 175.

The cooling medium used in cooling has an ultra-low temperature of −196° C., in the case of liquid nitrogen. In addition, in the joint portions and the sealed portions of the pipes for supplying the cooling medium, it is unavoidable to use different materials having different expansion coefficients, e.g., Teflon and stainless steel. Consequently, as discussed earlier in the first embodiment, slight clearances are sometimes formed in the sealed portions C to F by a stress or by freezing of moisture trapped in small gaps while the operation is repeatedly performed. In these situations, the cooling medium supplied through the inner pipe 168 of the cooling medium supply pipe line 19 passes through the seal 174 in the portion F to enter the space 178 formed between the outer pipe 161 of the joint device 151 and the auxiliary stainless steel pipe 175, and further passes through the seals 166, 172, and 173 in the portions E, D, and C, respectively. Consequently, the cooling medium leaks into the treatment chamber 11 through a passage 179 and the passage 171 for evacuation in the space 163 formed between the inner and outer pipes 160 and 161 of the joint device 151. The cooling medium thus leaking into the treatment chamber 11 gasifies in the reduced-pressure atmosphere in the treatment chamber to change the internal pressure of the chamber, producing an adverse effect on the function of the etching apparatus. If the leakage quantity is extremely large, the etching apparatus itself fails or is damaged.

In this embodiment, therefore, a pressure stabilizing means, e.g., a subcooler 113 for maintaining the supply pressure of the cooling medium constant is provided in the cooling medium supply system 150, a pressure detecting means 180 for detecting the supply pressure of the cooling medium is provided downstream of the subcooler 113, and an arithmetic means 181 for calculating the change rate of the supply pressure of the cooling medium detected by the pressure detecting means 180 is also provided, as in FIG. 5. In this arrangement, the embodiment employs a control method by which the cooling medium system is shut off to stop the supply of the cooling medium to the cooling jacket 18 if the pressure value detected by the pressure detecting means 180 exceeds a predetermined value and the change rate of the pressure value calculated by the arithmetic means 181 also exceeds a predetermined value.

The system configuration to which the control method of this embodiment is applied will be described below with reference to FIG. 5. As illustrated in FIG. 5, a cooling medium, e.g., liquid nitrogen Contained in the rocks (liquid nitrogen cylinder) 111 is supplied from the vacuum double-insulated piping 114 to the gas-liquid separator 112 via a first valve 182, and separated into a gas phase and a liquid phase by the separator 112. When the cooling medium, e.g., liquid nitrogen is supplied through the vacuum double-insulated piping 114 in this way, an intake of external heat is prevented, but the prevention is not perfect. Therefore, gasification of the liquid-phase cooling medium is unavoidable to some extent. In addition, a pressure loss in the piping decreases the saturated vapor pressure, and this decreases the liquid temperature. Consequently, the cooling medium being supplied partially evaporates.

If the liquid nitrogen supplied through the piping in this state is introduced into the cooling jacket 18 by opening the valve, the liquid nitrogen is injected in a state in which the gas and liquid phases are mixed. This makes control of the supply very difficult in this embodiment, therefore, the subcooler 113 is provided in the cooling medium supply system 150 at a position as near as possible to the etching apparatus 10, in order to stabilize the cooling medium supply pressure. This will be described below with reference to FIGS. 8 and 9.

Figure 8:
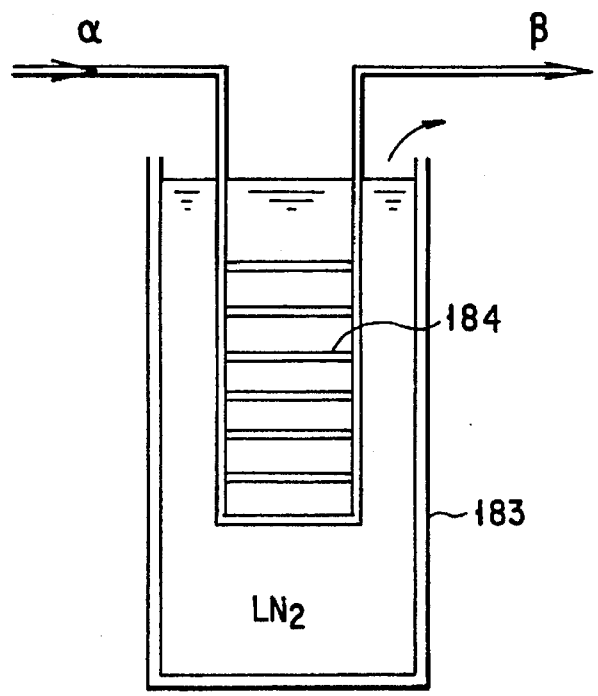
FIG. 8 is a schematic view showing a subcooler applicable to the plasma etching apparatus in FIG. 4.

As shown in FIG. 8, the subcooler 113 has a structure in which a heat exchange coil 184 constituted by thin hollow tubes arranged in the form of a ladder is housed in a hollow cylindrical Dewar vessel 183 having an upper portion open in the air. The Dewar vessel 189 is filled with liquid nitrogen. Therefore, the cooling medium supplied in the gas phase-liquid phase mixed state from a supply path α is again cooled by heat exchange in the thin tubes of the heat exchange coil 184 and discharged as a supercooled liquid to a discharge path β. That is, the subcooler 113 can perform heat exchange between liquid nitrogen at the atmospheric pressure and liquid nitrogen in the piping by cooling a portion of liquid nitrogen to the atmospheric pressure saturated temperature (−196° C.), thereby making a supercooled liquid (the saturated temperature is −196° C. or more because the pressure in the piping is higher than the atmospheric pressure).

Figure 9:
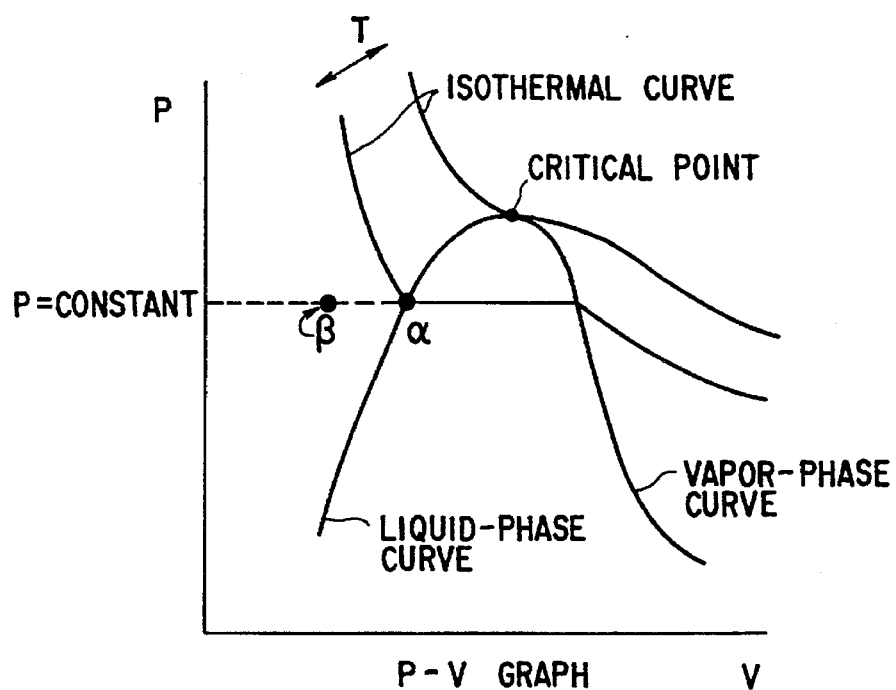
FIG. 9 is a P-V graph showing the function of the subcooler in FIG. 8.

By supercooling the supplied cooling medium by the subcooler 113 in this manner, it is possible to shift the P-V state of the cooling medium from the position α to the position β in a graph shown in FIG. 9. Therefore, evaporation of the cooling medium can be suppressed, and this reduces a flash loss at the use point. Consequently, the cooling medium can be introduced into the cooling jacket 18 at a stabilized pressure and therefore can be controlled easily.

As shown in FIG. 5, the cooling medium supercooled by the subcooler 113 as described above is introduced into the cooling jacket 18 from the cooling medium supply pipe line 19 via the joint device 151 and circulated in the cooling jacket 18. The cooling medium is then discharged through the cooling medium discharge pipe line 20 and exhausted to the outside via the evaporator 115 in this embodiment, the pressure detector 180 monitors the supply pressure of the cooling medium at any instant and transmits the detected value to the arithmetic circuit 181. The arithmetic circuit 181 compares the detected value with a preset reference value. At the same time, the pressure detector 180 monitors the internal pressure of the treatment chamber 11 and transmits the detected value to the arithmetic circuit 181. The arithmetic circuit 181 calculates the change rate of the supply pressure value and compares the calculated value with a preset reference value.

It is found that, if a so-called cold leak occurs in the joint device 151 as mentioned earlier, the supply pressure of the cooling medium rises, and the rise is very abrupt in this embodiment, therefore, this phenomenon is used as a determination criterion for operating a safety mechanism when a cold leak takes place. That is, in this embodiment, the upper limit of an allowable supply pressure and the upper limit of an allowable supply pressure change rate are preset. If both the pressure value detected by the pressure detector 180 and the change rate calculated by the arithmetic circuit 181 exceed their respective upper limits, an interrupt signal is transmitted to a second valve 184 provided upstream of the subcooler 113, thereby temporarily interrupting the supply of the cooling medium. With this operation, it is possible to prevent an event in which a cold leak produces a serious influence on the internal treatment pressure of the treatment chamber 11 or causes a failure or breaking of the etching apparatus 10 itself. In this embodiment, the pressure value detected by the pressure detector 180 and the pressure change value calculated by the arithmetic circuit 181 are used as determination criteria for interrupting the supply of the cooling medium. However, the internal pressure value of the treatment chamber 11 detected by the pressure detector 180 can also be used as a determination criterion for the control.

An operation of the plasma etching apparatus to which the treatment apparatus control method according to this embodiment is applicable will be briefly described below.

As in the first embodiment, the wafer W is transferred from a load lock chamber into the treatment chamber 11 via a gate valve, and chucked and held on the mounting surface of the susceptor 17 of the mounting table 15 by the electrostatic chuck 21.

Subsequently, the cooling medium supply system 150 illustrated in FIG. 5 supplies a cooling medium, e.g., liquid nitrogen into the cooling jacket 18 via the pressure stabilizing device or the subcooler 113. The surface to be treated of the wafer W is cooled to a desired temperature by transfer of coldness from the cooling medium. This temperature is detected by the first temperature detecting means 35 at any instant, and the controller 36 operates the heater 29 or the like on the basis of the detection signal. In this manner, the wafer W is held at the predetermined temperature.

In this case, if there is a possibility that a cold leak occurs in the joint device 151 and the resulting leakage cooling medium flows into the treatment chamber 11 to vary the internal pressure of the chamber, the second valve 184 provided in the cooling medium supply system is temporarily closed by using the pressure value detected by the pressure detecting means 180 and the change rate of the detected pressure value, as the determination references. Consequently, it is possible to prevent variations in the internal pressure of the treatment chamber 11 or a failure or destruction of the treatment apparatus resulting from a cold leak of the supplied cooling medium.

A treatment gas, e.g., HF is supplied into the treatment chamber 11 held in this optimum treatment environment, and at the same time RF power is applied from the RF power supply 125 to the susceptor 17 as the lower electrode, thereby generating a plasma in the treatment chamber 11. Consequently, a desired etching treatment can be performed on the surface to be treated of the wafer W. After the etching, the residual treatment gas and the reaction products are well exhausted from the treatment chamber 11. Thereafter, the wafer W is transferred to the load lock chamber via the gate valve and to a cassette chamber by a transfer arm. In this fashion, a series of treatment processes are finished. In this embodiment, as in the above embodiment, when the etching apparatus in which the low-temperature treatment is performed is returned to room temperature, first and second heating means 31 and 32 heat portions where occurrence of a cold leak is expected, i.e., moisture trap portions, thereby removing moisture from these portions. Therefore, even when a treatment is performed at an ultra-low temperature, no cold leak takes place due to freezing and expansion of moisture because there is no residual moisture. This makes it possible to effectively avoid formation of cracks in the constituting members.

Third Embodiment

In performing the low-temperature treatment as discussed above, if an excess liquid-phase cooling medium, e.g., excess liquid nitrogen is supplied to a cooling medium container of an etching apparatus, the liquid-phase cooling medium is sometimes gasified by, e.g., boiling and is discharged directly in a liquid phase from a cooling medium discharge pipe line before the cooling medium acts as an efficient coldness source; that is, a so-called overflow phenomenon takes place in some cases. To avoid waste of a cooling medium caused by this overflow, feedback control for the cooling medium supply amount is conventionally performed by detecting an optimum filling amount of a cooling medium by using liquid level detectors provided in a cooling medium container. To detect the cooling medium filling amount, prism-like liquid level detectors, for example, are arranged at predetermined positions, e.g., two positions at which the upper and lower limits of the liquid level can be measured. Measurements are performed by sending light to the prism-like liquid level detectors through optical fibers and making use of the difference in reflectance between portions inside and outside the cooling medium.

If, however, a liquid-phase cooling medium gasifies through, e.g., boiling, a large number of bubbles are formed, and these bubbles rise to the surface of the cooling medium all at once. This troubles the surface of the cooling medium to result in an unstable liquid level and also makes it difficult for the liquid level detectors to accurately detect the position of the liquid level of the cooling medium, since the bubbles adhere to the liquid level detectors (a hunting phenomenon of a liquid nitrogen valve). In addition, as will be described later with reference to FIG. 15, if boiling strongly occurs at the bottom of a cooling medium container, an unstable state in which the temperature at the bottom is higher than that in the upper portion takes place. A so-called roll-over phenomenon in which this unstable state transits to a stable state abruptly increases evaporation of a liquid-phase cooling medium, resulting in a troubled surface and an unstable liquid level of the cooling medium. Consequently, it becomes difficult for the liquid level detectors to accurately measure the position of the liquid level of the cooling medium.

This embodiment provides a treatment apparatus control method capable of stabilizing the detection of the liquid level of a cooling medium by using an anti-bubble means for stabilizing the liquid level of a liquid-phase cooling medium contained in a cooling medium container, and also capable of preventing the temperature reversal phenomenon in the liquid-phase cooling medium as discussed above by encouraging transfer of coldness between the upper and lower layers of the cooling medium.

That is, this embodiment provides a treatment apparatus control method characterized in that a bubble impinging means, e.g., a staggered plate-like member or punching plate is arranged in a substantially horizontal direction in a cooling medium container, thereby preventing bubbles produced by boiling in a cooling medium filled region of the cooling medium container from directly rising to the surface of the cooling medium. In this embodiment, it is also possible to use a heat exchanging means, such as a metal heat conductor or a metal heat pipe, for encouraging heat exchange between the upper and lower layers of a cooling medium filled in the cooling medium container, or a bubbling device capable of gas supply.

A system in which the treatment apparatus control method according to this embodiment is applied to a plasma etching apparatus will be described below with reference to the accompanying drawings. FIG. 10 is a schematic view showing the plasma etching apparatus according to this embodiment. In FIG. 10, the same reference numerals as in FIG. 1 denote the same parts, and a detailed description thereof will be omitted.

A cooling jacket 18 for flowing and circulating a cooling medium is provided in a susceptor support table 17. A cooling medium supply pipe line 211 and a cooling medium discharge pipe line 212 vertically extend upward from the bottom of the cooling jacket 18 and open at a position higher than the liquid level of a cooling medium. During a cooling operation in this cooling medium supply system, a liquid-phase cooling medium, e.g., liquid nitrogen supplied from a cooling medium source is introduced into the cooling jacket 18 from the cooling medium supply pipe line 211 through an appropriate piping means, e.g., stainless steel vacuum double-insulated piping 213. The liquid nitrogen introduced is stored in a liquid phase in the cooling jacket 18 to cause heat exchange by nuclear boiling primarily near the bottom of the jacket. Consequently, the liquid nitrogen rises as bubbles in the liquid phase and is stored in the upper portion of the cooling jacket 18. The gas-phase cooling medium stored in the upper portion of the cooling jacket 18 is then exhausted outside an etching apparatus 10 through the cooling medium discharge pipe line 212 and vacuum double-insulated piping 214. In the cooling jacket 18, bubble impinging plates 215 are arranged in a substantially horizontal direction, and upper-and-lower layer heat exchanging means 216 are arranged in a substantially vertical direction. These members stabilize the liquid level and prevent the roll-over of the temperature. Details of this arrangement will be described later with reference to FIGS. 11 to 15.

An upper liquid level detector 39 and a lower liquid level detector 40 for measuring the liquid level of the cooling medium in the cooling jacket 18 are also arranged in the cooling jacket 18. The detectors 39 and 40 send information about the liquid level of the cooling medium to a controller 36, so the controller 36 can adjust the supply quantity of the cooling medium to be introduced from the cooling medium supply pipe line 211 into the cooling jacket 18. As the liquid level detectors 39 and 40, it is possible to use, e.g., prism-like optical liquid level detectors. Whether the liquid level detectors 39 and 40 are inside or outside of the cooling medium can be determined on the basis of the difference in reflectance of light, which is transmitted to the detectors through, e.g., optical fibers, between portions inside and outside the cooling medium. The plasma etching apparatus 10 for use in the treatment apparatus control method according to this embodiment is arranged as discussed above.

Several examples of the structure of the cooling jacket 18 of a mounting table designed on the basis of this embodiment will be described below with reference to FIGS. 11 to 14. In these examples, the same reference numerals denote parts having the same functions and a detailed description thereof will be omitted.

Figure 11:
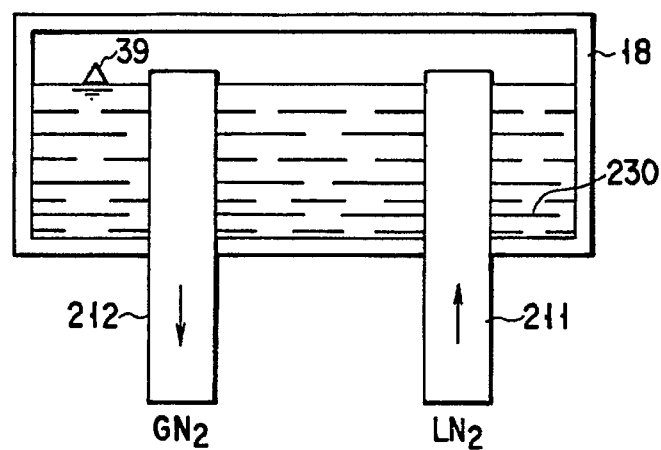

In the first example of this embodiment illustrated in FIG. 11, a plurality of layers of stationary plates 230 as the bubble impinging means 215 are arranged in a substantially horizontal direction so as to be staggered in the cooing jacket 18 of the mounting table 17. As discussed above, heat transfer is done by gasification of a liquid-phase cooling medium caused by nuclear boiling at the bottom of the cooling jacket 18. With this arrangement of the first example, however, a large number of bubbles generated impinge on any of the stationary plates 230 to weaken their energy in rising to the surface of the cooling medium. Since the bubbles reach the cooling medium surface in this weakened state, they are stored in the upper portion of the cooling jacket 18. This prevents the cooling medium surface from being troubled to result in an unstable liquid level, or avoids a phenomenon in which bubbles adhere to the surface of the liquid level detector 39. Consequently, the liquid level can be stably, accurately detected. Note that punching plates can also be used as the stationary plates 230, as well as the staggered plates.

Figure 12:
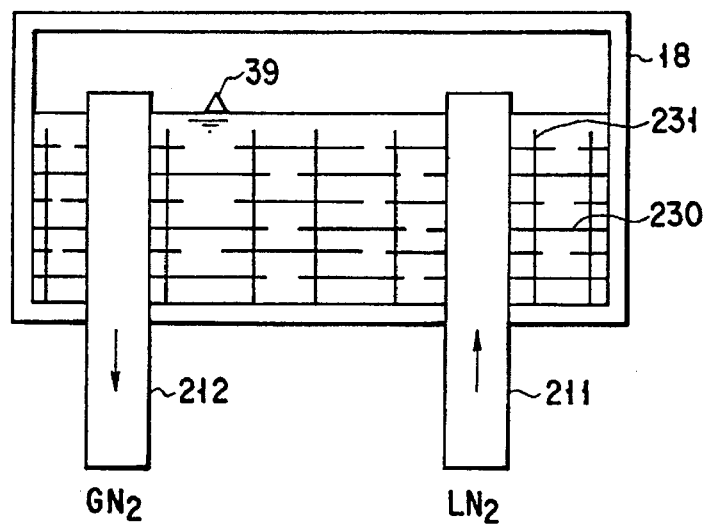

In an arrangement in FIG. 12, metal heat conductors 231 are additionally arranged in the vertical direction so as to extend through the stationary plates 230 in the first example in FIG. 11. The metal heat conductors 231 encourage heat exchange between the upper and lower layers of a liquid-phase cooling medium, avoiding a so-called roll-over phenomenon.

For easy understanding of the examples illustrated in FIGS. 11 to 14, the roll-over phenomenon will be described with reference to FIG. 15. FIG. 15 shows the temperature distribution of liquid nitrogen filled in the cooling jacket 18, in which a temperature T rises from the left to the right in the plane of the paper. As indicated by a solid line in FIG. 15, liquid nitrogen is stable when the temperature in its upper layer is higher than that in its lower layer. In practice, however, since boiling strongly takes place at the bottom of the cooling jacket 18, liquid nitrogen is in many cases in an unstable state in which the temperature in the lower layer is higher than that in the upper layer, as indicated by a dotted line in FIG. 15. In this case, since the system in a cooling medium transits from the unstable state to the stable state, the upper low-temperature layer and the lower high-temperature layer are reversed and mixed by some stimulus, and this sometimes causes an instantaneous large-scale boiling. This phenomenon is called a roll-over phenomenon. Consequently, a large number of bubbles are produced at once to significantly trouble the surface of a cooling medium, and this makes an accurate liquid level measurement impossible. Additionally, since an abrupt pressure rise takes place, a countermeasure for releasing this abrupt pressure rise is also required.

The metal heat conductors 231 used in the second example in FIG. 12 are for avoiding the roll-over phenomenon explained above. That is, since heat exchange is performed constantly between the upper and lower layers of liquid nitrogen via the metal heat conductors 231, liquid nitrogen is hardly rendered unstable with the above arrangement. This makes it possible to avoid occurrence of the roll-over.

Figure 13:
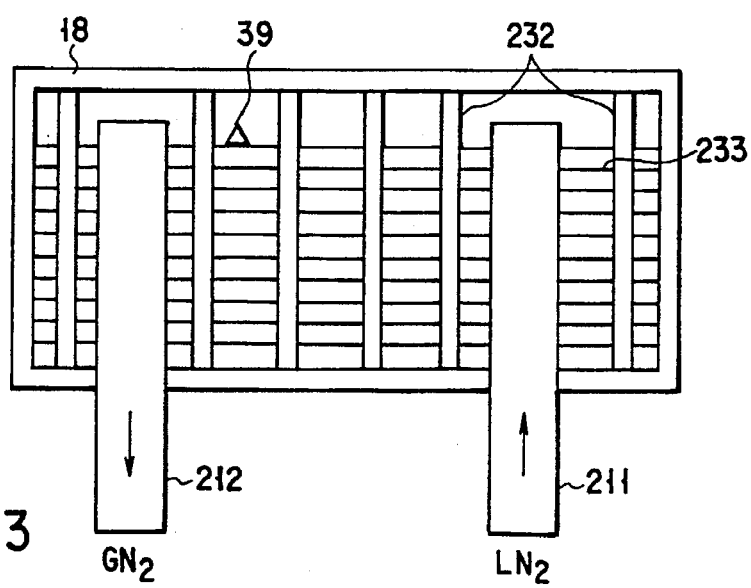

In the third example in FIG. 13, heat pipes 232 are arranged vertically at proper intervals in the cooling jacket 18 in order to further enhance the heat exchange between the upper and lower layers. In this example, a plurality of layers of punching plates 233 having a large. number of holes are also arranged as the bubble impinging means 215 in a substantially horizontal direction. It is of course necessary to layer these punching plates 233 such that holes of the adjacent punching plates 233 do not overlap each other. With this arrangement, the heat exchange between the upper and lower layers of liquid nitrogen is done more efficiently. Consequently, occurrence of the roll-over phenomenon can be avoided more effectively.

The fourth example illustrated in FIG. 14 uses a bubbling device 236 in which a plurality of comb-like pipes 235 extend to open downward from horizontally arranged piping 234. This bubbling device 236 is supplied with an inert gas, such as nitrogen or helium, as a bubbling gas from a gas source (not shown). With this arrangement, it is possible to impinge bubbles produced by bubbling on bubbles generated at the bottom of the cooling jacket 18 and thereby weaken the energy of the bubbles before they reach the liquid surface. This prevents the liquid surface from being troubled. At the same time, since heat exchange is performed by proper stirring of the upper and lower layers of liquid nitrogen effected by bubbling, liquid nitrogen in the cooling jacket 18 is hardly rendered unstable, so the roll-over can be avoided efficiently in the fourth example shown in FIG. 14, a safety valve means 237 is provided to prevent the internal pressure of the cooling jacket 18 from rising to a predetermined value or more. That is, although the roll-over phenomenon can be avoided by the above arrangement of this embodiment, the roll-over yet occurs in some cases to abruptly raise the internal pressure of the cooling jacket 18 temporarily. By releasing this abrupt pressure rise by the safety valve means 237, the liquid level can be further stabilized. In addition when an inert gas is bubbled into liquid nitrogen as in this fourth example, bubbles produced by this bubbling function as nuclei to make it possible to encourage nuclear boiling of liquid nitrogen. Consequently, it is possible to promote evaporation of liquid nitrogen to use it as an efficient coldness source.

An operation of the plasma etching apparatus to which the treatment apparatus control method according to this embodiment is applicable will be briefly described below.

As in the first embodiment, a wafer W is transferred into a treatment chamber 11 from a load lock chamber via a gate valve, and chucked and held on the mounting surface of the susceptor 17 of a mounting table 15 by an electrostatic chuck 21.

Subsequently, a cooling medium, e.g., liquid nitrogen is supplied from a cooling medium supply source into the cooling jacket 18 through the cooling medium supply pipe line 211. In this case, the surface of the liquid nitrogen supplied into the cooling jacket 18 is not troubled and no roll-over is caused because of the functions of the bubble impinging plates 215 and the upper-and-lower layer heat exchanging means 216 of this embodiment. Consequently, evaporation and heat exchange are performed efficiently in the liquid nitrogen, and the surface to be treated of the wafer W can be cooled to a predetermined temperature by transfer of coldness from the liquid nitrogen. This temperature is detected by a first temperature detecting means 35, and the controller 36 operates a heater 29 or the like on the basis of the detection signal. Consequently, the wafer W is maintained at the predetermined temperature.

A treatment gas, e.g., HF is supplied into the treatment chamber 11 held in this optimum treatment environment and at the same time RF power is applied from an RF power supply 125 to the susceptor 17 as the lower electrode, thereby generating a plasma in the treatment chamber 11. Consequently, a desired etching treatment can be performed on the surface to be treated of the wafer W. After the etching, the residual treatment gas and the reaction products are well exhausted from the treatment chamber 11. Thereafter, the wafer W is transferred to the load lock chamber via the gate valve and to a cassette chamber by a transfer arm. In this fashion, a series of treatment processes are completed. In this embodiment, as in the previous embodiments, when the etching apparatus in which the low-temperature treatment is performed is returned to room temperature, first and second heating means 31 and 32 heat portions where occurrence of a cold leak is expected, i.e., moisture trap portions, thereby removing moisture from these portions. Therefore, even when a treatment is performed at an ultra-low temperature, no cold leak takes place due to freezing and expansion of moisture because there is no residual moisture. This makes it possible to effectively avoid formation of cracks in the constituting members.

Fourth Embodiment

When a cooling medium is supplied from an external cooling medium source to a cooling medium container by using piping consisting of an insulating polymer material such as Teflon in performing a low-temperature treatment, leakage of the cooling medium may take place due to a heat shrinkage difference between the polymer material as the material of the piping and a metal material, such as stainless steel, used in a joint portion. The heat shrinkage difference between the two materials can no longer be neglected especially when an ultra-low-temperature cooling medium, e.g., liquid nitrogen is used. In addition, when a cooling medium discharge pipe line is provided in a cooling medium container independently of a cooling medium supply pipe line, a heat-insulating mechanism is also required for the cooling medium discharge pipe line. This results in a poor space utility of the treatment apparatus.

This embodiment provides a treatment apparatus control method capable of improving the throughput of a treatment by minimizing leakage of coldness of a cooling medium and shortening the time required for cooling an object to be treated.

That is, this embodiment provides a method of controlling a treatment apparatus including a cooling medium supply unit which is connected to a cooling medium container provided in a mounting table to contain a cooling medium and supplies a cooling medium from a cooling medium source into the cooling medium container, a cooling medium discharge unit which is provided on the outer circumference of the cooling medium supply unit and discharges a gas of the cooling medium gasified in the cooling medium container, and a reduced-pressure unit which is provided on the outer circumference of the cooling medium supply unit and is exposed to a reduced-pressure atmosphere, wherein the cooling medium is stably supplied at a high efficiency by preventing leakage of the cooling medium in a cooling medium supply path by flowing the cooling medium through a cooling medium discharge path.

A system in which the treatment apparatus control method according to this embodiment is applied to a plasma etching apparatus will be described below with reference to the accompanying drawings. The overall arrangement of the plasma etching apparatus is similar to that shown in FIG. 1. Therefore, a cooling medium supply/discharge pipe line as the characteristic feature of this embodiment will be described in detail below.

Referring to FIG. 1, a cooling medium container, e.g., a cooling jacket 18 for flowing and circulating a cooling medium, such as liquid nitrogen, is formed in a susceptor support table 16. As shown in FIG. 16, this cooling jacket 18 is connected to a cooling medium supply/discharge pipe line 310 for supplying and discharging liquid nitrogen 301. The cooling medium supply/discharge pipe line 310 is constituted by a cooling medium supply unit 311, a cooling medium discharge unit 312, and a vacuum double pipe 313. The cooling medium supply unit 311 supplies the liquid nitrogen 301 into the cooling jacket 18. The cooling. medium discharge unit 312 is formed on the outer circumference of the cooling medium supply unit 311 and discharges nitrogen gas of the liquid nitrogen 301 evaporated in the cooling jacket 18. The vacuum double pipe 313 is formed as a reduced-pressure unit on the outer circumference of the cooling medium discharge unit 312.

The vacuum double pipe 313 has a double pipe structure constituted by an intermediate pipe 314 and an outer pipe 315. The intermediate pipe 314 consists of an electrically insulating material, such as ceramics, with a low thermal conductivity and a heat stretchability smaller than those of metal materials, such as stainless steel. The outer pipe 315 is spaced by a predetermined distance from the outer circumference of the intermediate pipe 314 and consists of ceramics. An upper joint member 317 consisting of, e.g., stainless steel is connected to the upper portions of the intermediate pipe 314 and the outer pipe 315, which are concentrically arranged. The upper joint member 317 has a flow path 316 in its central portion connected to the intermediate pipe 314 and the outer pipe 315. The upper joint portion 317 has a communication port 319 which is airtightly connected to a bottom 14 via a sealing member, e.g., an O-ring 318 and communicates with a space defined by the intermediate pipe 314 and the outer pipe 315. The upper portion of the upper joint member 317 is airtightly connected to the bottom wall of the susceptor support table 16 such that an opening 320 projects above the liquid level of the liquid nitrogen 301. The lower portions of the intermediate pipe 314 and the outer pipe 315 are airtightly connected to a lower joint member 321 consisting of, e.g., stainless steel.

The cooling medium supply unit 311 includes a cooling medium supply pipe 323, the lower joint member 321, and a cooling medium source 324. The cooling medium supply pipe 323 is connected to the upper portion of an inner pipe 322, concentrically arranged inside the intermediate pipe 314 and consisting of ceramics, and is so formed as to keep the airtightness with the upper joint member 317. The cooling medium supply pipe 323 has an opening which is open in the liquid nitrogen 301. The lower joint member 321 is airtightly connected to the lower portion of the inner pipe 322. The cooling medium source 324 is connected to the lower joint member 321 and supplies the liquid nitrogen 301.

The cooling medium discharge unit 312 has an evaporator 326 connected to the lower joint member 321 and communicating with a space formed between the inner pipe 322 and the intermediate pipe 314 through a through hole 325 formed in the lower joint member 321. This evaporator 326 is so designed as to draw nitrogen gas filled above the surface of the liquid nitrogen 301 through the opening 320 and discharge the gas outside the system. A protection pipe 327 connected to the bottom 14 is also provided on the outer circumference of the outer pipe 315 to protect the cooling medium supply/discharge pipe line 310.

Upper and lower liquid level detectors 328 and 329 for measuring the liquid level of the liquid nitrogen 301 contained in the cooling jacket 18 are arranged in the cooling jacket 18. The upper and lower liquid level detectors 328 and 329 transmit information about the position of the liquid level of a cooling medium to a controller 352. The controller 352 sends information concerning the supply quantity of a cooling medium to the cooling medium source 324 on the basis of the liquid level information. The cooling medium source 324 supplies a cooling medium into the cooling jacket 18 through the cooling medium supply unit 311 on the basis of the cooling medium supply quantity information. As the liquid level detectors 328 and 329, it is possible to use, e.g., prism-like optical liquid level detectors. In this case, whether the liquid level detectors 328 and 329 are inside or outside of a liquid is determined by using the difference in reflectance of light, which is sent to the liquid level detectors by an optical fiber means, between portions inside and outside the liquid.

Figure 17:
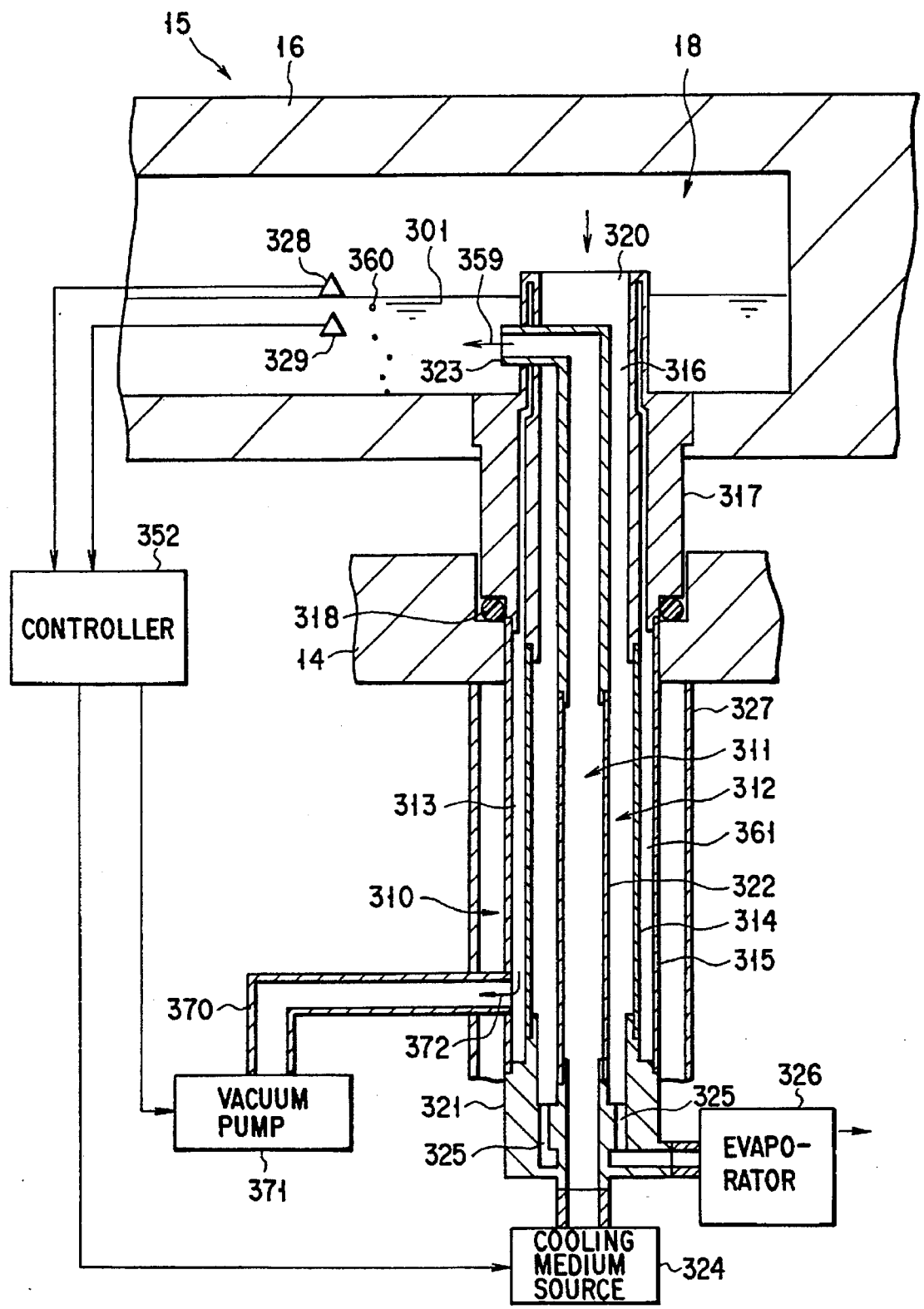
FIGS. 17 and 18 are schematic views each showing a cooling jacket of the plasma etching apparatus in FIG. 16.

FIG. 17 shows another example of the cooling medium supply/discharge pipe line 310 according to this embodiment. In FIG. 17, the same reference numerals as in FIG. 16 denote the same parts, and a detailed description thereof will be omitted.

As in FIG. 17, the vacuum double pipe 313 having a space 361 is connected to an exhausting means, e.g., a vacuum pump 371 through a pipe 370 airtightly connected to the outer pipe 315 and can therefore evacuate the space 361. The vacuum pump 371 is controlled by the controller 352. The upper portion of the upper joint member 317 does not communicate with a treatment chamber. The space 361 is so formed as to reach the upper portion of the upper joint member 317, i.e., the vicinity of the opening 320.

With this arrangement, the space 361 of the vacuum double pipe 313 is evacuated in a direction indicated by an arrow 372 in FIG. 17 by the vacuum pump 371 and is thereby held in a predetermined reduced-pressure atmosphere. At the same time, the interior of the space 361 is isolated from the varying reduced-pressure atmosphere in the treatment chamber. This reduces variations in heat loss from the cooling medium supply/discharge pipe line 310 resulting from variations in the reduced-pressure atmosphere in the treatment chamber. Consequently, a more stable heat-insulating effect can be obtained.

An operation of the plasma etching apparatus to which the treatment apparatus control method according to this embodiment is applicable will be briefly described below.

As in the first embodiment, a wafer W is transferred from a load lock chamber into a treatment chamber 11 via a gate valve, and chucked and held on the mounting surface of a susceptor 17 of a mounting table 15 by an electrostatic chuck 21.

Subsequently, the controller 352 controls, in accordance with prestored programs, the power supply quantity of a power supply 30 for supplying power to a heater 29, while monitoring temperature information from a first temperature detecting means 35, and also controls the supply quantity of the cooling medium source 324 for supplying the liquid nitrogen 301 to the cooling jacket 18 (FIG. 16) through the cooling medium discharge unit 312, thereby setting the temperature of the wafer W at a predetermined temperature, e.g., −20° C. or less.

The controller 352 then controls an RF power supply 27 and also controls the flow rate of a treatment gas and the exhaust quantity of the vacuum pump to adjust the internal pressure of the treatment chamber 11, thereby generating a plasma between the susceptor 17 as the lower electrode and a top wall 28 as the upper electrode. Consequently, the surface to be treated of the wafer W is etched. During the etching, the wafer W is overheated to a temperature higher than the predetermined temperature by the heat of the plasma. To maintain the wafer temperature at the predetermined temperature, therefore, the controller 352 controls the power supply quantity of the power supply 30 and the supply quantity of the cooling medium source 324 as mentioned above.

Details of control of the cooling medium supply system for circulating the liquid nitrogen 301 in the cooling jacket 18 will be described below with reference to FIG. 16. The controller 352 sends information of a predetermined flow rate to the cooling medium source 324, and the cooling medium source 324 supplies the liquid nitrogen 301 at the flow rate based on the information into the cooling jacket 18 via the cooling medium supply unit 311. At that time, control is so performed as to hold the liquid level of the liquid nitrogen 301 at a predetermined position between the liquid level detectors 328 and 329 while monitoring the detection signals from the detectors 328 and 329. The liquid nitrogen 301 introduced in a direction indicated by an arrow 359 in FIG. 16 into the liquid nitrogen 301 contained in the cooling jacket 18 is subjected to nuclear boiling at the bottom of the cooling jacket 18. The resultant heat exchange cools the susceptor support table 16 to transfer coldness to the susceptor 17.

Bubbles 360 (nitrogen gas) of the liquid nitrogen 301 formed by nuclear boiling at the bottom of the cooling jacket 18 fill the space between the surface of the liquid nitrogen 301 and the cooling jacket 18. The nitrogen gas is then drawn from the opening 320 to the evaporator 326 through the cooling medium discharge unit 312, heated up to the atmospheric temperature or higher, and discharged to the outside. Since a reduced-pressure atmosphere is set in the treatment chamber by the vacuum pump, the space 361 of the vacuum double pipe 313 is evacuated in a direction indicated by an arrow 362 in FIG. 16 through the communication port 319 and held in a reduced-pressure atmosphere at the same pressure as in the treatment chamber.

When the liquid nitrogen 301 is introduced into the cooling jacket 18, the interior of the space 361 of the vacuum double pipe 313 is held in the reduced-pressure atmosphere at the same pressure as in the treatment chamber. Therefore, no coldness leaks from the cooling medium supply/discharge pipe line 310, so a loss of coldness can be prevented. In addition, the low-temperature nitrogen gas produced by gasification in the cooling jacket 18 flows into the cooling medium discharge unit 312 arranged on the outer circumference of the cooling medium supply unit 311 for supplying the liquid nitrogen 301 into the cooling jacket 18. Consequently, unnecessary leakage of coldness from the cooling medium supply unit 311 can be prevented, and this makes it possible to efficiently supply the liquid nitrogen 301 at approximately −196° C. from the cooling medium source 324. Furthermore, the cooling medium supply unit 311 is not in direct contact with other members, e.g., the bottom 14 and the susceptor support table 16, and the cooling medium supply pipe 323 having an opening which is open in the liquid nitrogen 301 is connected to the portion where the upper joint member 317 is in contact with the liquid nitrogen 301. Therefore, there is no leakage of coldness from the cooling medium supply unit 311 through other members, and consequently the liquid nitrogen can be supplied more effectively from the cooling medium source.

As discussed above, the liquid nitrogen 301 at about −196° C. can be efficiently supplied from the cooling medium source 324 into the cooling jacket 18 without any coldness loss. Therefore, the wafer W to be etched can be cooled to an ultra-low temperature close to the temperature of the liquid nitrogen 301, e.g., −196° C. This makes it possible to improve the throughput or the like of the etching treatment. In addition, since the liquid nitrogen can be supplied without any coldness loss, it is possible to shorten the cooling time for cooling the wafer W from room temperature to a predetermined temperature, e.g., −150° C. Consequently, the wafer W can be cooled to a predetermined set temperature within a short time period even if overheated by the heat of the plasma. This makes it possible to improve the throughput of the etching treatment and the yield of the wafer W.

In this embodiment, liquid nitrogen is used as the cooling medium, and a ceramic heater is used as the heater for temperature adjustment. However, it is also possible to use, e.g., liquid helium as the cooling medium and another type of a heater as the temperature adjusting heater in addition, the cooling medium supply pipe airtightly connected to the upper joint member and having an opening which is open in the cooling medium is used in this embodiment. However, a plurality of openings may be formed in the upper joint member so that the cooling medium is radially injected into the cooling jacket.

In this embodiment, as in the previous embodiments, when the etching apparatus in which the low-temperature treatment is performed is returned to room temperature, first and second heating means 31 and 32 heat portions where occurrence of a cold leak is expected, i.e., moisture trap portions, thereby removing moisture from these portions. Therefore, even when a treatment is performed at an ultra-low temperature, no cold leak takes place due to freezing and expansion of moisture because there is no residual moisture. This makes it possible to effectively avoid formation of cracks in the constituting members.

Fifth Embodiment

In each of the above embodiments, in treating an object to be treated, a heat transfer gas, such as He gas, having a high thermal conductivity is flowed through a gap between a cooling mechanism and a susceptor to encourage heat transfer in the gap. Therefore, the object to be treated can be cooled relatively efficiently. On the other hand, since a heat-insulating structure between the cooling mechanism and a mounting table is imperfect, there is a possibility that the mounting table is unnecessarily cooled in changing the set temperature of the mounting table, as well as in the treatment. Consequently, an expensive cooling medium, e.g., liquid nitrogen may be wasted, or a certain disadvantage may result in maintenance. For this reason, a structure has been conventionally proposed in which a gap is formed in a heat transfer path between a susceptor and a cooling mechanism and He gas is flowed into and out from the gap. In this structure, a heat transfer path is formed between the susceptor and the cooling mechanism by filling He gas in the gap. In addition, a vacuum heat-insulating layer is formed by setting a so-called vacuum state by removing He, thereby shutting off the heat transfer path between the susceptor and the cooling mechanism.

In this structure, if moisture is contained in He gas to be sealed and this He gas is sealed in the gap present in the middle of the heat transfer path, frost forms on the surface of the gap due to cooling from the cooling mechanism. When the structure is returned from this state to room temperature, the frost becomes water and gathers in a certain portion. When an ultra-low temperature is set again, the gathered water becomes a mass of ice to cause volume expansion, and this may lead to destruction of the structure. In this embodiment, therefore, there is provided a treatment apparatus control method capable of preventing structural destruction caused by a heat transfer medium, such as He gas, sealed in a gap formed in a heat transfer path.

That is, this embodiment provides a method of controlling a treatment apparatus including a means for supplying a heat transfer medium in a gap between a susceptor and a cooling jacket, wherein the dew point of the heat transfer medium is set to be lower than the temperature of a cooling medium. In this method, it is preferable that in the heat transfer medium supply means, a means for removing moisture from the heat transfer medium be arranged in a heat transfer medium supply path. It is more preferable that a dew point meter for detecting the moisture content of the heat transfer medium to be supplied be also provided, and an alarm be generated or the supply of the heat transfer medium be stopped if this dew point meter detects that the moisture of the heat transfer medium reaches a predetermined amount.

Figure 18:
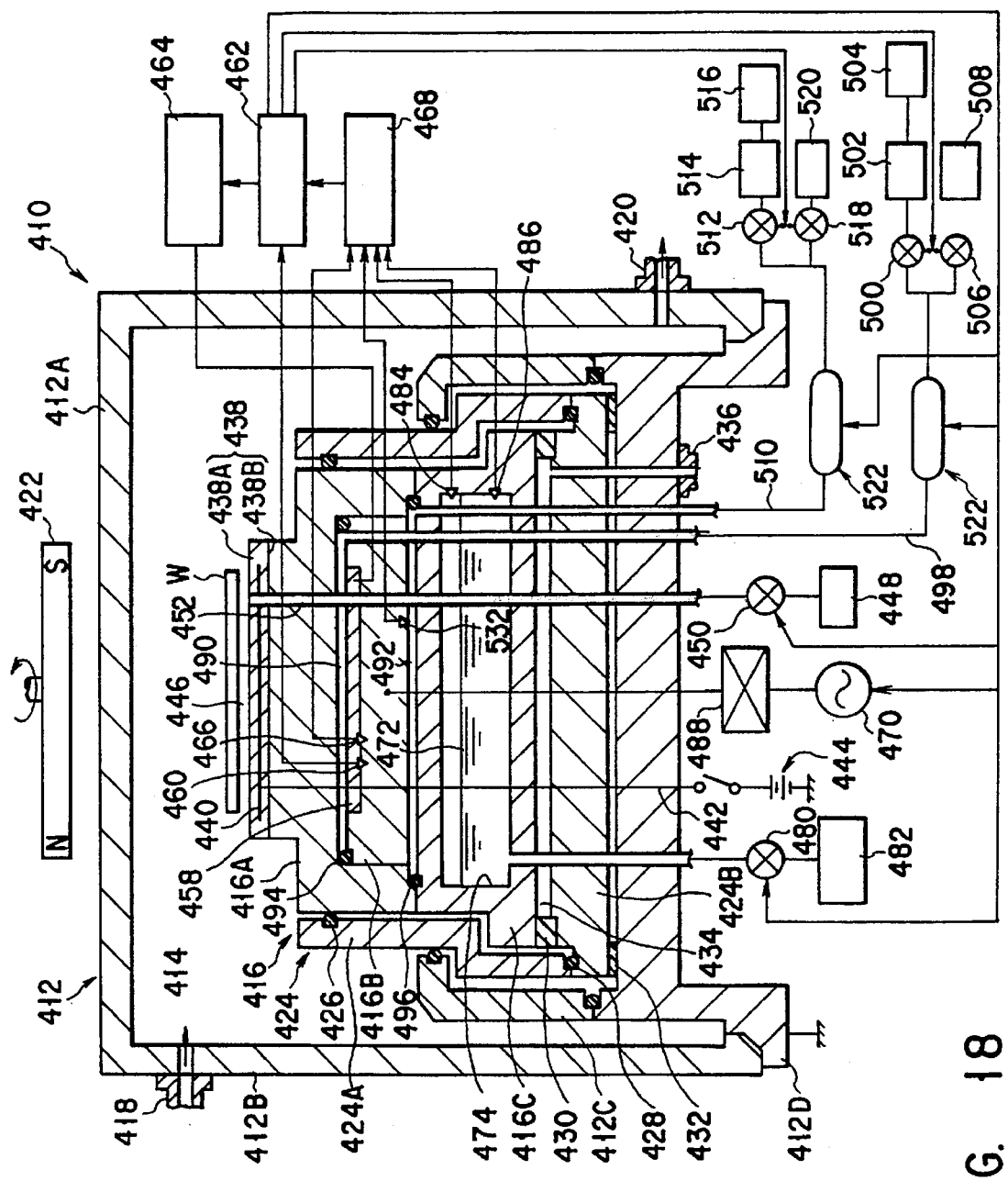

This embodiment also provides a method of controlling a treatment apparatus including a means for supplying a heat transfer medium in a gap between a susceptor and a cooling jacket, a means for exhausting the heat transfer medium from the gap, a dew point meter arranged at a position in the gap or in the vicinity of the gap and in a heat transfer medium supply path to detect the moisture content of the heat transfer medium, and an open/close valve arranged in a heat transfer medium discharge path, wherein when it is determined on the basis of an output from the dew point meter that the detected moisture quantity reaches a predetermined amount, the open/close valve is closed to fill the gap with the heat transfer medium. In this method, it is preferable that a relief valve for maintaining the pressure constant be provided in the path for supplying the heat transfer medium to the gap, and the internal pressure of the gap be maintained constant when the open/close valve is closed by a signal from a controller A system in which the treatment apparatus control method according to this embodiment is applied to a plasma etching apparatus will be described below with reference to the accompanying drawings. FIG. 18 is a schematic view showing the plasma etching apparatus according to this embodiment.

This plasma etching apparatus 410 includes a treatment chamber 412 consisting of, e.g., aluminum, and a treatment space 414 is airtightly formed in the treatment chamber 412. A susceptor 416 for mounting and fixing an object to be treated, e.g., a wafer W is housed in the treatment chamber 412. The treatment chamber 412 has a double structure constituted by an outer cylindrical wall 412B formed integrally with a top 412A, and an inner cylindrical wall 412C having an inner flange in its upper portion. Both the outer cylindrical wall 412B and the inner cylindrical wall 412C are airtightly mounted on a bottom 412D.

A gas supply pipe line 418 is provided in an upper portion of the outer cylindrical wall 412B of the treatment chamber 412. The gas supply pipe line 418 can introduce a treatment gas, e.g., HF gas from a treatment gas source (not shown) into the treatment space 414 via a mass flow controller or the like (not shown). A gas exhaust pipe line 420 is provided in a lower portion of the outer cylindrical wall 412B of the treatment chamber 412 on the side away from the side of the gas supply pipe line 418. The treatment chamber 412 can be evacuated by an exhaust means such as a vacuum pump (not shown) through this gas exhaust pipe line 420.

A magnetic field generator, e.g., a permanent magnet 422 for forming a horizontal magnetic field on the surface of the wafer W is rotatably arranged above the top 412A of the treatment chamber 412. Magnetron discharge can be generated in the treatment chamber 412 by forming the horizontal magnetic field by the permanent magnet 422 and an electric field perpendicular to the horizontal magnetic field. In a space defined by the inner cylindrical wall 412C and the bottom 412D of the treatment chamber 412 in FIG. 18, an outer circumference insulating member 424A and a bottom insulating member 424B of an insulating frame 424 are so arranged as to cover the outer circumferential surface and the bottom of the susceptor 416. By arranging the susceptor 416 in the space formed by the insulating frame 424 in this manner, the susceptor 416 is kept insulated from the treatment chamber 412 arranged around the susceptor 416.

To prevent the treatment chamber 412, the insulating frame 424, and the susceptor 416 from contacting each other, these members are spaced apart from each other so that they are mutually insulated, via O-rings 426 and 428 and spacers 430 and 432 made from insulating materials. In addition, a gap 434 formed between the insulating frame 424 and the susceptor 416 can be evacuated by an exhaust means such as a vacuum pump (not shown) through an exhaust pipe line 436.

In this embodiment, the susceptor 416 is constituted by a three-layer structure denoted by reference numerals 416A, 416B, and 416C. An electrostatic chuck 438 is mounted on the upper surface of the first subsusceptor 416A as the upper layer of the susceptor 416. The wafer W is placed and fixed on the upper surface of the electrostatic chuck 438. The electrostatic chuck 438 is formed by, e.g., adhering a pair of polyimide resin films 438A and 438B such that a thin conductive film 440, such as a copper foil, is sandwiched between them. The conductive film 440 is connected to a DC power supply 444 through a conductor wire 442. The electrostatic chuck 438 is normally formed into a flat circular sheet in correspondence with the shape of the wafer W.

The DC power supply 444 applies a high DC voltage, e.g., 2.0 kV to the electrostatic chuck 438 through the conductor wire 442. Consequently, static electricity is generated by polarization on the surface of the electrostatic chuck 438, and the resulting Coulomb's force chucks the wafer W on the surface of the electrostatic chuck 438.

A heat transfer gas is supplied from a first heat transfer gas source 448 to a space 446 formed between the surface of the electrostatic chuck 438 and the wafer W through a valve 450 and a first heat transfer gas supply pipe line 452. In this embodiment, an inert gas, such as He gas, is used as the heat transfer gas. This heat transfer gas can transfer coldness from the heat transfer gas source 448 with a minimum loss. The heat transfer gas is not limited to He gas but may be any given gas provided that the gas is a heat transfer medium which does not easily react with a treatment gas in the treatment chamber 412 even if the gas leaks. Airtightness is not kept in the space 446, unlike in first and second gaps to be described later. However, since the wafer W is fixed on the first subsusceptor 416A of the susceptor 416 by the Coulomb's force of the electrostatic chuck 438, a heat transfer medium with a pressure of less than 20 Torr can be substantially airtightly held by this Coulomb's force.

A temperature adjusting heater 458 for adjusting the temperature of the surface to be treated of the wafer W is provided in the second subsusceptor 416B as the intermediate layer of the susceptor 416. The heater 458 is so arranged as to oppose the lower surface of the first subsusceptor 416A on the upper surface of the second subsusceptor 416B. A first temperature detecting means 460 for detecting the temperature of the heater 458 is arranged near the heater 458. The first temperature detecting means 460 is connected to a controller 462. In accordance with information of the detected temperature from the first temperature detecting means 460, the controller 462 drives a heater driver 464 to perform feedback control for the heater. In this embodiment, in addition to the first temperature detecting means 460, a second temperature detecting means 466 for monitoring is arranged near the heater 458 and the first temperature detecting means 460. A signal from this monitoring temperature detecting means 466 is transmitted to a temperature monitor 468 which forms an interlock together with the controller 462. This makes it possible to prevent faulty operations of the apparatus and control the heater temperature stably. In this embodiment, the first temperature detecting means 460 and the monitoring temperature detecting means 466 are arranged near the heater 458 of the second subsusceptor 416B. However, these temperature detecting means can be arranged at any given positions where changes in the temperature characteristic of the susceptor 416 can be detected, so they can be arranged at positions meeting this condition.

Furthermore, the first subsusceptor 416A is so arranged as to almost completely cover the outer circumferential surface of the second subsusceptor 416B. Therefore, it is possible to prevent external contamination to the second subsusceptor 416B having complicated wiring since it is connected to an RF power supply 470, and to replace only the first subsusceptor 416A independently of the second subsusceptor 416B. This facilitates maintenance of the etching apparatus. In addition, an insulating member such as an O-ring is inserted between the side wall of the first subsusceptor 416A and the side wall 424A of the insulating frame 424. This prevents a treatment gas from entering this portion and thereby prevents contamination of the first and second subsusceptors 416B and 416C of the susceptor 416.

A cooling jacket 474 as a cooling medium container for storing a cooling medium 472, such as liquid nitrogen, is provided in the third subsusceptor 416C as the lower layer of the susceptor 416. The cooling jacket 474 communicates with a cooling medium source 482 via a cooling medium supply pipe line 476 and a valve 480. Liquid level detectors 484 and 486 are arranged in the upper and lower portions, respectively, of the wall of the cooling jacket 474. These liquid level detectors are used to monitor the liquid level of the cooling medium 472 and connected to the temperature monitor 468. As discussed earlier, the liquid level detectors 484 and 486 are constituted by optical liquid level detectors. Therefore, by setting upper and lower liquid level positions, as critical positions, in these liquid level detectors, the controller 462 can control the supply of the cooling medium 472. The inner wall surface of the cooling jacket 474 is so formed as to be porous and can therefore cause nuclear boiling. The temperature difference between the cooling medium 472 contained in the cooling jacket 474 and the cooling jacket 474 is kept at about 1° C. The susceptor 416 constituted by the first, second, and third subsusceptors 416A, 416B, and 416C is insulated by the insulating frame 424 from the treatment chamber 412 which forms the treatment space 414, thereby forming a cathode coupling with an electrically identical polarity. The second subsusceptor 416B is connected to the RF power supply 470 via a matching unit 488. Therefore, the susceptor 416 and the treatment chamber 412 that is grounded constitute opposing electrodes, so it is possible to generate a plasma between the electrodes by applying RF power.

In the susceptor 416, a first gap 490 and a second gap 492 are formed as boundary spaces between the first subsusceptor 416A as the upper layer and the second subsusceptor 416B at the intermediate layer including the heater 458 and between the second subsusceptor 416B and the third subsusceptor 416C as the lower layer, respectively. The first and second gaps 490 and 492 are formed to connect and disconnect the heat transfer path between the susceptor 416 and the cooling jacket 474. The first and second gaps 490 and 492 are airtightly formed by using sealing members 494 and 496, e.g., O-rings, respectively.

The first gap 490 formed between the first and second subsusceptors 416A and 416B is connected through a pipe line 498 to a second heat transfer gas supply source 504 via a valve 500 and a mass flow controller 502. Opening/closing of the valve 500 is controlled by the controller 462. When opened, the valve 500 can supply and seal an inert gas, e.g., He gas from the second heat transfer gas supply source 504. The first gap 490 is also connected to an exhausting means 508, e.g., a vacuum pump via a valve 506 provided in the pipe line 498. Opening/closing of the valve 506 is controlled by the controller 462. Therefore, by opening the valve 506 in accordance with a signal from the controller 462, the cooling medium sealed in the first gap 490 can be exhausted to evacuate the first gap 490.

The second gap 492 formed between the second and third subsusceptors 416B and 416C is connected through a pipe line 510 to a third heat transfer gas supply source 516 via a valve 512 and a mass flow controller 514. Opening/closing of the valve 512 is controlled by the controller 462. When opened in accordance with a signal from the controller 462, the valve 512 can supply and seal an inert gas, e.g., He gas from the third heat transfer gas supply source 516. The second gap 492 is also connected to an exhausting means 520, e.g., a vacuum pump via a valve 518 arranged in the pipe line 510. Opening/closing of the valve 518 is controlled by the controller 462. By opening the valve 518 in accordance with a signal from the controller 462, the heat transfer gas sealed in the second gap 492 can be exhausted to evacuate the second gap 492.

The size of the first and second gaps 490 and 492 is 1 to 100 μm, preferably about 50 μm. In this embodiment, an inert gas, such as He gas or argon gas, is sealed in the gaps 490 and 492. However, the heat transfer gas to be sealed need only be a medium which can transfer coldness from the cooling jacket 474 as a coldness source into the heat transfer path formed in the susceptor 416 with a minimum heat loss, and which does not react with the treatment gas in the treatment chamber 414 even if the medium leaks.

The pressure of the inert gas to be sealed in the first and second gaps 490 and 492 is 300 Torr or less, preferably about 70 Torr. Normally, the heat resistance of the heat transfer medium to be sealed in the first and second gaps 490 and 492 decreases as its pressure is raised but takes an almost fixed value when the pressure exceeds 300 Torr. Therefore, a good heat transfer path can be formed in the susceptor 416 by properly selecting the pressure of the heat transfer medium within the above range.

In the plasma etching apparatus 410 having the above arrangement, the heat transfer path for the susceptor 416 can be connected or disconnected by sealing or exhausting the heat transfer gas with respect to the first and second gaps 490 and 492 under the control of the controller 462. That is, when the heat transfer gas is sealed in the first and second gaps 490 and 492, the heat transfer path for the susceptor 416 is formed. When the heat transfer gas is exhausted, on the other hand, the first and second gaps 490 and 492 are evacuated to form vacuum heat-insulating layers. Consequently, coldness from the cooling jacket 474 is no longer transferred. Consumption of the cooling medium such as liquid nitrogen can be minimized when a vacuum heat-insulated state is set in this way. A timing at which this vacuum heat-insulated state is set is when loading/unloading of the wafer W is to be performed or when maintenance in which the etching apparatus itself is exposed to the atmosphere is to be performed.

The heat transfer gas to be supplied to the first and second gaps 490 and 492 is set to have a dew point lower than the temperature of the cooling medium 472 contained in the cooling jacket 474. In this case, the dew point means a moisture condensation temperature which depends on the content of moisture in a gas. For example, a "high dew point" means that moisture condensation is caused at a high temperature, i.e., the moisture content is large. Therefore, the heat transfer gas is maintained in a state in which it does not cause freezing or moisture condensation even when cooled by the cooling medium 472. For this purpose, a moisture removing means 522 with a structure illustrated in FIG. 19 is arranged in the heat transfer gas supply path connected to at least one of the first and second gaps 490 and 492, which is closer to the cooling jacket 474, i.e., the second gap 492 between the second and third subsusceptors 416B and 416C. In the arrangement shown in FIG. 19, the moisture removing means 522 are provided not only in the transfer gas supply path connected to the second gap 492 but also in the heat transfer gas supply pipe line 498 connected to the first gap 490.

More specifically, the moisture removing means 522 has a structure capable of heating and evaporating moisture while passing a heat transfer gas through it or is constituted by a purification unit 522A having a moisture absorption structure using a catalyst. In the case of the pipe line 510 which forms the heat transfer gas supply path for the second gap 492, this purification unit 522A is arranged in a bypass 524 parallel to the pipe line 510. First and second open/close valves 526 and 528 are arranged on both the sides of the purification unit 522A in the bypass 524. A third open/close valve 530 is arranged in the pipe line 498 parallel to the bypass 524, at a position at which the valve 530 opposes the purification unit 522A. Opening/closing of the first to third open/close valves 526, 528, and 530 is controlled by the controller 462 to which they are connected. Of the three open/close valves, the first and second open/close valves 526 and 528 are opened when the heat transfer gas is to be supplied to the second gap 492 through the pipe line 498. The third open/close vale 530 is opened when the heat transfer gas is to be exhausted from the second gap 492 through the pipe line 498.

In the pipe line 510, a dew point meter 532 is arranged downstream of the bypass 524 in the supply direction of the heat transfer gas indicated by an arrow in FIG. 19. This dew point meter 532 is connected to the controller 462. When the moisture content in the heat transfer gas reaches a predetermined amount, the dew point meter 532 outputs a signal indicating this state. In this case, the predetermined amount corresponds to a moisture content by which moisture condensation occurs due to cooling by the cooling medium 472. When the moisture content of the heat transfer gas detected by the dew point meter 532 reaches the predetermined amount, the controller 462 generates an alarm by using, e.g., a display unit (not shown) and/or stops the supply of the heat transfer gas to the pipe line 510. In this case, of the first to third open/close valves 526, 528, and 530, at least the second and third open/close valves 528 and 530 are closed by the signal from the controller 462. At that time, the valves 500 and 512 located on the heat transfer gas supply side are, of course, also closed. In this manner, if the moisture content reaches the predetermined amount, the supply of the heat transfer gas to the gaps is stopped. This prevents moisture condensation in the gaps 490 and 492.

In this embodiment, a moisture concentration of $9.2 \times 10^{-12}$ (V·ppm) is obtained when the dew point of the heat transfer gas, from which moisture is removed by the purification unit 522A, is $-150°$ C., so it is necessary to select the heat transfer gas on the basis of this dew point. Another example of the system using this dew point meter 532 will be described below with reference to FIG. 20.

In the example illustrated in FIG. 20, a direction switching valve 534 is arranged on the downstream side in the heat transfer gas supply direction indicated by an arrow in the bypass 524 in FIG. 19. This direction switching valve 534 is normally set in a position at which the heat transfer gas can be flowed to the second gap 492. When switched from this position, the valve 534 is put to a position at which the heat transfer gas is flowed toward a recovery unit (not shown).

In this embodiment, while the dew point meter 532 detects that the moisture content in the heat transfer gas is the predetermined amount or smaller, the direction switching valve 534 is kept in the normal state. Therefore, the heat transfer gas passing through the purification unit 522A can flow to the second gap 492 via the direction switching valve 534. If, on the other hand, the dew point meter 532 detects that the moisture content in the heat transfer gas exceeds the predetermined amount, the direction switching valve 534 is switched from the normal position. Consequently, the heat transfer gas is refluxed to the recovery unit without reaching the second gap 492. Therefore, since the heat transfer gas containing moisture which causes Condensation is not supplied into the second gap 492, freezing in the gap can be prevented.

In this embodiment, the supply pressure from the heat transfer gas supply source is not disclosed. Since the second gap 492 is an airtight space, however, it is possible to provide a relief valve for maintaining the pressure to be supplied to the gap constant in the pipe line 510, or to provide a flow rate adjusting valve having a throttle function for adjusting the flow rate of the heat transfer gas in the pipe line 510 in accordance with the internal pressure of the second gap 492.

This embodiment is not limited to the above arrangements but may be modified without departing from the gist of the present invention. For example, as the heat transfer medium, an Ar gas, an Ne gas, an $O_2$ gas, an $H_2$ gas or the like can be used in addition to a gas such as He gas. In addition, as the means for removing moisture from the heat transfer medium, a structure as shown in FIG. 21 can be used. In FIG. 21, a portion of the pipe line 510 is dipped in a vessel 540 storing a cooling medium, such as liquid nitrogen, liquid helium, or liquid hydrogen. Therefore, moisture in the heat transfer medium passing through the pipe line 510 is condensed as the medium passes through the cooling medium, and the heat transfer medium in this dried state is supplied to the gap. In this structure, the passage of the heat transfer medium is sometimes interfered with by the moisture condensed in the pipe line 510. To prevent this, as shown in FIG. 22, a portion of the vessel 540 may be extended to be dipped in a cooling medium 541, thereby extracting only bubbles 542 generated from the heat transfer medium.

In this embodiment as described above, the dew point of the heat transfer medium is set to be lower than the temperature of the cooling medium. For this reason, the heat transfer medium supplied to the gap does not cause moisture condensation even if cooled by the cooling medium. This makes it possible to prevent freezing resulting from condensation of the heat transfer medium in the gap and thereby prevent structural destruction of the gap. Additionally, if moisture contained in the heat transfer medium in the heat transfer medium supply path exceeds a predetermined amount, an alarm is generated or the supply of the heat transfer medium is stopped. Consequently, moisture condensation caused by cooling from the cooling medium is avoided. The heat transfer medium is not filled into the gap unless the moisture in the heat transfer medium reaches a predetermined amount. That is, if the moisture of the heat transfer medium to be supplied to the gap is not the predetermined amount or less, the medium is in tact discharged, and the discharge is stopped when the moisture content reaches the predetermined amount. Consequently, the heat transfer medium is filled in the gap after being set in a state in which no moisture condensation is caused. The heat transfer medium filled in the gap when the moisture content is the predetermined amount or less is kept at a predetermined pressure, i.e., filled up in the gap, thereby ensuring the heat transfer path including the gap.

In this embodiment, as in the previous embodiments, when the etching apparatus in which the low-temperature treatment is performed is returned to room temperature, heating means heat portions where occurrence of a cold leak is expected, i.e., moisture trap portions, thereby removing moisture from these portions. Therefore, even when a treatment is performed at an ultra-low temperature, no cold leak takes place due to freezing and expansion of moisture because there is no residual moisture. This makes it possible to effectively avoid formation of cracks in the constituting members.

The first to fifth embodiments discussed above are merely examples for explaining the treatment apparatus control method according to the present invention, so the method of the invention is not limited to these embodiments. That is, the present invention can be modified without departing from the scope of the appended claims, e.g., some of the above embodiments can be combined.

In addition, the present invention has been described by taking the system using liquid nitrogen as a cooling medium. However, the effect of the present invention can be achieved by using a liquid helium, a liquid oxygen, a liquid hydrogen, or the like as a cooling medium.

In each of the above embodiments, the method of the present invention is applied to a plasma etching apparatus. However, the method of the present invention is also applicable to a cooling mechanism of any of a CVD apparatus, an ashing apparatus, a sputter apparatus, a sample mounting table of an apparatus, such as an electron microscope, for inspecting an object to be treated at low temperatures, and a sample mounting table for evaluating semiconductor materials or devices. It is also possible to apply the method of the present invention to an ion injection apparatus or a burn-in apparatus for performing treatments in a reduced-pressure atmosphere. Furthermore, the arrangement of the plasma etching apparatus is not limited to those of the above embodiments but may be the one in which a feeder rod consisting of a hollow conductor is connected to a susceptor through a susceptor support table, and a plasma is generated by applying RF power of, e.g., 13.56 MHz to this feeder rod.

As is apparent from the above description, according to the treatment apparatus control method of the present invention, when the etching apparatus is returned from a low temperature to room temperature, portions where occurrence of a cold leak is expected, i.e., moisture trap portions are heated, thereby evaporating and removing moisture from these portions. Therefore, even when a treatment is performed at an ultra-low temperature, no cold leak takes place due to freezing and expansion of moisture because there is no residual moisture. This makes it possible to effectively avoid formation of cracks in the constituting members. Consequently, there can be provided a stable treatment apparatus free from failures.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of controlling a treatment apparatus including a treatment chamber adjustable to a desired reduced-pressure atmosphere, a mounting table arranged in said treatment chamber to mount an object to be treated, a cooling medium container provided in said mounting table, and a cooling medium circulating system made by integrally forming a cooling medium supply pipe line for supplying a cooling medium to said cooling medium container and a cooling medium discharge pipe line arranged to surround said cooling medium supply pipe line for discharging said cooling medium from said cooling medium container, wherein when a treatment is performed for said object to be treated while decreasing a temperature of said object to be treated by cooling said mounting table by using heat transfer from said cooling medium supplied to said cooling medium container by said cooling medium supply pipe line, leakage of coldness between said cooling medium supply pipe line and said cooling medium discharge pipe line is prevented by flowing a liquid cooling medium through said cooling medium supply pipe line and flowing a gaseous cooling medium, which is produced by gasification of said liquid cooling medium in said cooling medium container, through said cooling medium discharge pipe line.

2. A method according to claim 1, wherein a reduced-pressure atmosphere is set outside said cooling medium supply system.

3. A method according to claim 1, wherein said liquid cooling medium to be flowed through said cooling medium supply pipe line is supplied directly to said cooling medium container.

4. A method according to claim 1, wherein said treatment apparatus is one apparatus selected from the group consisting of a CVD apparatus, an ashing apparatus, a sputter apparatus, and an apparatus for inspecting an object to be treated at a low temperature.

5. A treatment apparatus comprising:

a treatment chamber adjustable to a desired reduced-pressure atmosphere;

a mounting table arranged in said treatment chamber to mount an object to be treated;

a cooling medium container provided in said mounting table; and a cooling medium circulating system prepared by integrally forming a cooling medium supply pipe line for supplying a liquid cooling medium to said cooling medium container and a cooling medium discharge pipe line arranged substantially concentrically with respect to said cooling medium supply pipe line and discharging a gaseous cooling medium, which is produced by gasification of said liquid cooling medium in said cooling medium container, from said cooling medium container, wherein a treatment to said object is performed while decreasing a temperature of said object by cooling said mounting table by using heat transfer from said cooling medium supplied to said cooling medium container.

6. An apparatus according to claim 5, which further comprises means for providing a reduced pressure outside said cooling medium circulating system.

7. An apparatus according to claim 5, wherein said treatment apparatus is one selected from the group consisting of a CVD apparatus, ashing apparatus, sputtering apparatus, and apparatus for inspecting a treated object at low temperatures.

8. A treatment apparatus comprising:

a treatment chamber adjustable to a reduced-pressure atmosphere;

a mounting table arranged in said treatment chamber to mount an object to be treated;

a cooling medium container provided in said mounting table; and a cooling medium circulating system having an intermediate pipe for supplying a liquid cooling medium to said cooling medium container and an outer pipe arranged substantially concentrically with said cooling medium supply pipe and discharging a gaseous cooling medium from said cooling medium container, wherein a treatment to said object is performed while decreasing a temperature of said object by cooling said mounting table by using heat transfer from said cooling medium supplied to said cooling medium container.

9. A treatment apparatus as claimed in claim 8, wherein the intermediate pipe is ceramic.

10. A treatment apparatus as claimed in claim 8, wherein the outer pipe is ceramic.

11. A treatment apparatus as claimed in claim 5, wherein leakage of coldness is prevented between said cooling medium supply pipe line and said cooling medium discharge pipe line.

12. A treatment apparatus as claimed in claim 5, wherein said cooling medium discharge pipe line surrounds said cooling medium supply pipe line.

* * * * *